(12) United States Patent
Kim et al.

(10) Patent No.: US 8,969,996 B2
(45) Date of Patent: Mar. 3, 2015

(54) SEMICONDUCTOR DEVICE WITH BURIED WORD LINE STRUCTURES

(71) Applicant: Samsung Electronics Co., Ltd., Suwon-si (KR)

(72) Inventors: Eun-jung Kim, Daegu (KR); Seung-pil Ko, Hwaseong-si (KR); Yong-june Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 190 days.

(21) Appl. No.: 13/780,793

(22) Filed: Feb. 28, 2013

(65) Prior Publication Data
US 2013/0234279 A1  Sep. 12, 2013

(30) Foreign Application Priority Data

Mar. 7, 2012  (KR) ........................ 10-2012-0023601

(51) Int. Cl.
*H01L 21/00* (2006.01)
*H01L 21/762* (2006.01)
*H01L 29/861* (2006.01)
*H01L 21/308* (2006.01)
*H01L 27/102* (2006.01)
*H01L 27/22* (2006.01)

(52) U.S. Cl.
CPC ........ *H01L 21/76232* (2013.01); *H01L 29/861* (2013.01); *H01L 21/3086* (2013.01); *H01L 27/1021* (2013.01); *H01L 27/224* (2013.01)
USPC ............................ 257/491; 257/213; 257/329

(58) Field of Classification Search
USPC .......................................... 257/491, 213, 329
See application file for complete search history.

(56) References Cited

U.S. PATENT DOCUMENTS

| 6,740,921 | B2 | | 5/2004 | Matsuoka et al. | |
|---|---|---|---|---|---|
| 7,205,199 | B2 | * | 4/2007 | Park et al. | 438/270 |
| 7,208,751 | B2 | | 4/2007 | Ooishi | |
| 7,368,352 | B2 | * | 5/2008 | Kim et al. | 438/268 |
| 7,442,602 | B2 | * | 10/2008 | Park et al. | 438/237 |
| 7,470,588 | B2 | * | 12/2008 | Cho et al. | 438/272 |
| 7,541,252 | B2 | * | 6/2009 | Eun et al. | 438/381 |
| 7,670,909 | B2 | * | 3/2010 | Cho | 438/268 |
| 7,709,356 | B2 | * | 5/2010 | Kim et al. | 438/478 |
| 7,767,565 | B2 | * | 8/2010 | Chung | 438/585 |
| 7,785,960 | B2 | * | 8/2010 | Cho | 438/242 |
| 7,842,569 | B2 | * | 11/2010 | Kim et al. | 438/257 |

(Continued)

FOREIGN PATENT DOCUMENTS

KR  1020090049270 A  5/2009

*Primary Examiner* — Laura Menz
(74) *Attorney, Agent, or Firm* — Myers Bigel Sibley & Sajovec, P.A.

(57) ABSTRACT

A semiconductor device with buried word line structures and methods of forming the semiconductor device are provided. The semiconductor device includes a plurality of insulating line patterns extending in a direction in a substrate, a plurality of word lines alternately with ones of the plurality of insulating line patterns, the plurality of word lines extending in the direction and comprising a metal, a plurality of first doped regions on respective ones of the plurality of the word lines and between two adjacent ones of the plurality of insulating line patterns, an interlayer insulating film on the plurality of insulating line patterns and the plurality of first doped regions, the interlayer insulating film including a plurality of openings exposing upper surfaces of ones of the plurality of first doped regions and a plurality of second doped regions contacting respective ones of the plurality of first doped regions within the openings.

8 Claims, 23 Drawing Sheets

(56) References Cited

U.S. PATENT DOCUMENTS

| | | |
|---|---|---|
| 7,842,999 B2 | 11/2010 | Takaishi |
| 7,994,061 B2 * | 8/2011 | Jung ............................ 438/700 |
| 8,048,737 B2 | 11/2011 | Kim et al. |
| 8,148,222 B2 * | 4/2012 | Zahurak et al. ............. 438/212 |
| 8,648,414 B2 * | 2/2014 | Tang et al. ................... 257/332 |
| 2007/0246775 A1 | 10/2007 | Park et al. |
| 2007/0284623 A1 * | 12/2007 | Kim et al. .................... 257/213 |
| 2008/0113469 A1 * | 5/2008 | Eun et al. ..................... 438/102 |
| 2008/0185569 A1 | 8/2008 | Park et al. |
| 2009/0004797 A1 * | 1/2009 | Lee ............................... 438/270 |
| 2009/0072341 A1 | 3/2009 | Liu et al. |
| 2009/0114981 A1 * | 5/2009 | Sung et al. ................... 257/329 |
| 2009/0163017 A1 * | 6/2009 | Cho .............................. 438/595 |
| 2010/0148233 A1 | 6/2010 | Fujimoto |
| 2010/0163830 A1 | 7/2010 | Chang et al. |
| 2010/0240184 A1 * | 9/2010 | Jung et al. ................... 438/270 |
| 2011/0020998 A1 | 1/2011 | Oh et al. |
| 2011/0092041 A1 * | 4/2011 | Lai et al. ..................... 438/381 |
| 2011/0210302 A1 | 9/2011 | Tsukada et al. |
| 2012/0025300 A1 * | 2/2012 | Chung et al. ................ 257/330 |
| 2013/0001682 A1 * | 1/2013 | Tang et al. ................... 257/331 |
| 2013/0122685 A1 * | 5/2013 | Kim ............................. 438/424 |
| 2013/0147048 A1 * | 6/2013 | Kuh et al. .................... 257/768 |
| 2013/0224929 A1 * | 8/2013 | Ko et al. ...................... 438/382 |
| 2013/0234090 A1 * | 9/2013 | Lee et al. ......................... 257/2 |
| 2013/0234279 A1 * | 9/2013 | Kim et al. .................... 257/491 |

* cited by examiner

SEMICONDUCTOR DEVICE WITH BURIED WORD LINE STRUCTURES

CROSS-REFERENCE TO RELATED APPLICATIONS

This U.S. non-provisional patent application claims priority under 35 U.S.C. §119 to Korean Patent Application No. 10-2012-0023601, filed on Mar. 7, 2012, in the Korean Intellectual Property Office, the disclosure of which is hereby incorporated in its entirety.

BACKGROUND

The present disclosure generally relates to the field of electronics, and more particular to a semiconductor device.

Semiconductor devices are required to process a large amount of data with a decreased volume. Accordingly, the integration density of a semiconductor diode that constitutes the semiconductor device needs to be increased and the miniaturization of patterns formed in the semiconductor device is required. Also, due to the increases in the miniaturization of patterns, a high structural stability and a low power consumption of a semiconductor device are required.

To form a minute pattern a self-aligned reverse patterning process can be used in a line and space trench etching process. However, when an oxide mask is etched the oxide mask may lean and it may cause a problem during manufacturing processes.

SUMMARY

A semiconductor device may include a plurality of insulating line patterns extending in a direction in a substrate. The device may further include a plurality of word lines alternately with ones of the plurality of insulating line patterns. The plurality of word lines may extend in the direction and comprising a metal. The device may also include a plurality of first doped regions on respective ones of the plurality of the word lines and between two adjacent ones of the plurality of insulating line patterns. Moreover, the device may include an interlayer insulating film on the plurality of insulating line patterns and the plurality of first doped regions. The interlayer insulating film may include a plurality of openings exposing upper surfaces of ones of the plurality of first doped regions and a plurality of second doped regions that contact respective ones of the plurality of first doped regions within the openings.

According to various embodiments, the plurality of insulating line patterns may include a plurality of first insulating line patterns alternating with a plurality of second insulating line patterns, and ones of the plurality of first insulating line patterns contact respective ones of the plurality of word lines.

In various embodiments, an area where one of the plurality of first insulating line patterns contacts one of the plurality of word lines may be larger than an area where one of the plurality of second insulating line patterns contacts the one of the plurality of word lines.

According to various embodiments, ones of the plurality of first doped regions may comprise an n-type dopant and ones of the plurality of second doped regions may comprise a p-type dopant. One of the plurality of first doped regions and a respective one of the plurality of second doped regions may form a diode.

In various embodiments, upper surfaces of ones of the plurality of first doped regions may be coplanar with upper surfaces of ones of the plurality of insulating line patterns.

According to various embodiments, the device may further include an etch stop film between the interlayer insulating film and the plurality of insulating line patterns. The etch stop film may cover the plurality of insulating line patterns and expose upper surfaces of the plurality of first doped regions.

In various embodiments, each of the plurality of word lines may include a metal silicide film.

According to various embodiments, ones of the plurality of second doped regions may have a crystal direction identical to those of ones of the plurality of first doped regions.

A method of manufacturing a semiconductor device may include forming a metal film extending in a direction in a substrate. The method may further include forming word lines extending in the direction in the substrate by forming a first insulating line pattern that divides the metal film. The word lines may have respective first sidewalls contacting the first insulating line pattern. The method may also include forming second insulating line patterns extending in the direction and the second insulating line patterns may contact second sidewalls of the word lines in the substrate and the second sidewalls face the respective first sidewalls.

According to various embodiments, the method may further include forming metal silicide films in the word lines by performing a heat treatment process after forming the word lines.

In various embodiments, forming the metal lines may include forming a trench in the substrate, forming side trenches on a lower part of the trench by performing a sidewall etching process in a horizontal direction and forming the metal line in the trench and the side trenches.

According to various embodiments, the method may further include forming first doped regions on the respective word lines by injecting dopants into the substrate between forming the first insulating line pattern and forming the second insulating line patterns.

In various embodiments, forming of the second insulating line patterns may include forming a protrusion unit on the substrate that protrudes from the first insulating line pattern by removing an upper portion of the substrate with a predetermined thickness, forming spacers on the first doped regions and the protrusion unit, forming second device isolation trenches by etching the substrate using the spacers and the protrusion unit as etch masks, forming an insulating film on the substrate filling the second device isolation trenches and forming the second insulating line patterns within the second device isolation trenches by partially removing the insulating film.

According to various embodiments, the method may also include forming an etch stop film that exposes upper surfaces of the first doped regions and covers upper surfaces of the first and the second insulating line patterns and forming second doped regions on the respective first doped regions by a selective epitaxial growth (SEG) method.

In various embodiments, the method may further include forming a first doped region between the first and second insulating line patterns by injecting dopants into the substrate and performing a planarizing process making upper surfaces of the first doped regions be coplanar with upper surfaces of the first and the second insulating line patterns.

A method of manufacturing a semiconductor device may include forming a plurality of recessed lines extending in a direction within a semiconducting layer. Ones of the plurality of recessed lines may include upper openings and lower cavities that are wider than the upper openings, and open to a top surface of the semiconducting layer. The method may further include forming a plurality of conductive patterns in respective ones of the lower cavities of the plurality of recessed lines. The method may also include removing portions of the plurality of conductive patterns through respective ones of the upper openings to divide each of the plurality of the conductive patterns into separate word lines that extend in the direction. Moreover, the method may include forming a plurality of insulating line patterns self-aligned to respective ones of the plurality of recessed lines.

According to various embodiments, ones of the insulating line patterns may include protruding portions on the top surface of the semiconducting layer. Additionally, the method may include forming a plurality of spacers on sidewalls of respective ones of the protruding portions of the plurality of insulating line patterns, forming a plurality of trenches in the semiconducting layer extending in the direction by removing portions of the semiconducting layer exposed by the protruding portions and the plurality of spacers and forming a plurality of second insulating line patterns self-aligned to respective ones of the plurality of trenches.

In various embodiments, a bottom surface of one of the plurality of the insulating line patterns may be lower than a bottom surface of one of the word lines.

According to various embodiments, the method may further include forming a first doped region on one of the word lines and between two adjacent ones of the plurality of insulating line patterns and forming a second doped region on the first doped region. The first doped region and the second doped region may form a diode.

In various embodiments, forming one of the plurality of recessed lines may include forming a sacrificial line pattern extending in the direction on a substrate and forming the semiconducting layer on the sacrificial line pattern, forming a trench that divides the sacrificial line pattern into two portions exposing sidewalls of the sacrificial line patterns in the semiconductor layer extending in the direction and removing the sacrificial line pattern through the trench.

DETAILED DESCRIPTION OF THE EMBODIMENTS

Figure 1:
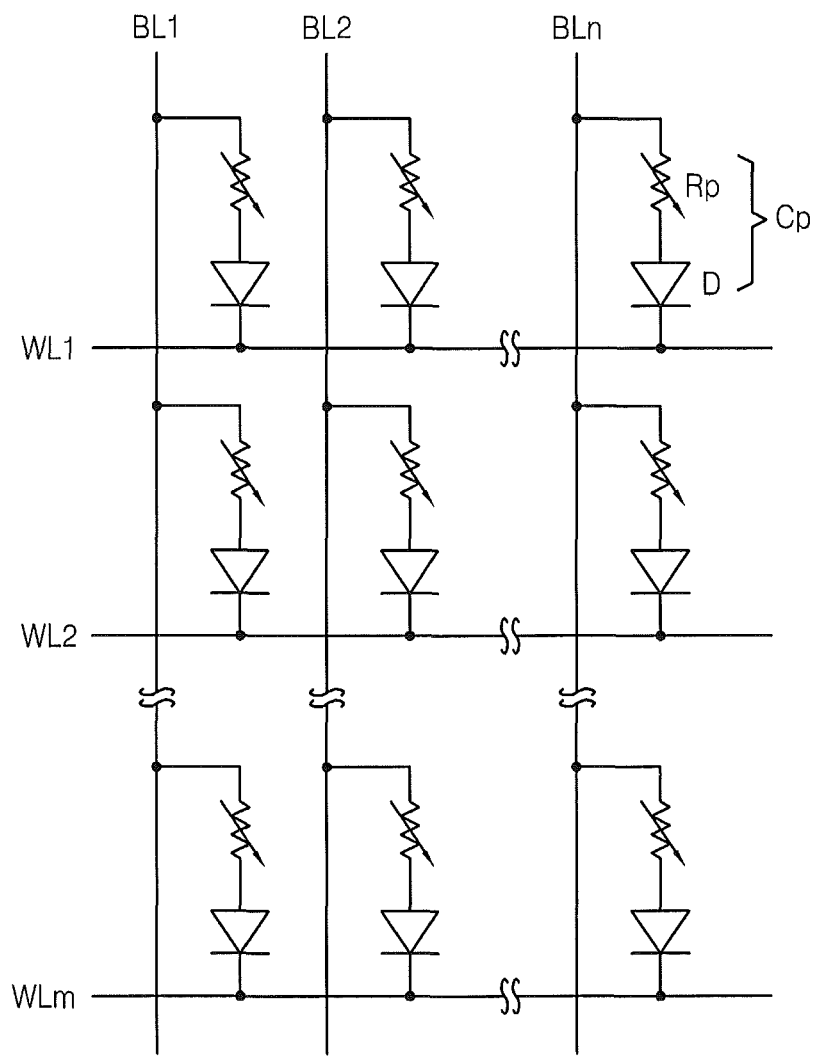
FIG. 1 is an equivalent circuit diagram of memory cells that each employ a diode.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, variations from the shapes of the illustration as a result, for example, of manufacturing techniques and/or tolerances, are to be expected. Thus, embodiments of the inventive concept should not be construed as limited to the particular shapes of the regions illustrated herein but are to include deviations in shapes that result, for example, from manufacturing. Like reference numerals in the drawings denote like elements throughout. In the drawings, various elements and regions are schematically drawn. Therefore, the current inventive concept is not limited to the relative sizes and gaps depicted in the accompanying drawings.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, "on," or "adjacent" another element, it can be directly coupled, connected, or responsive to, on, or adjacent the other element, or intervening elements may also be present. In contrast, when an element is referred to as being "directly coupled," "directly connected," or "directly responsive" to, "directly on," or "directly adjacent" another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

FIG. 1 is an equivalent circuit diagram of memory cells Cp that each employs a diode.

A semiconductor memory device according to embodiments of the inventive concept will now be described with reference to FIG. 1.

Referring to FIG. 1, the semiconductor memory device may include a plurality of word lines WL1, WL2, . . . , and WLm and a plurality of bit lines BL1, BL2, . . . , and BLn, which cross in a cell array region. Here, "m" and "n" may be positive integers.

The memory cells Cp may be provided at crossing points of the word lines WL1, WL2, . . . , and WLm and the bit lines BL1, BL2, . . . , and BLn. Each of the memory cells Cp may include an information storage element Rp and a diode D that are electrically connected to each other. A terminal of the information storage element Rp may be electrically connected to a P-type semiconductor of the diode D, and the other terminal of the information storage element Rp may be electrically connected to one of the bit lines BL1, BL2, . . . , and BLn. Also, an N-type semiconductor of the diode D may be electrically connected to one of the word lines WL1, WL2, . . . , and WLm.

Each of the information storage elements Rp may be a resistance memory element that shows at least two distinguishable resistance states, for example, a high resistance state and a low resistance state in response to applied signals. For example, the resistance memory element may include a Perovskite memory element, a phase-change memory element, a magnetic memory element, a conductive metal oxide memory element, a solid electrolyte memory element, and a polymer memory element. The Perovskite memory element may include a colossal magnetoresistive (CMR) material and a high temperature superconducting (HTSC) material. In a solid electrolyte memory element, metal ions may move in a solid electrolyte. Thus, the solid electrolyte memory element may include a material that forms a conductive bridge.

Hereinafter, exemplary embodiments in which a phase-change memory element is employed as the information storage element Rp will be described. Accordingly, descriptions below may apply to a semiconductor device that employs the other memory elements described above.

Figure 2:
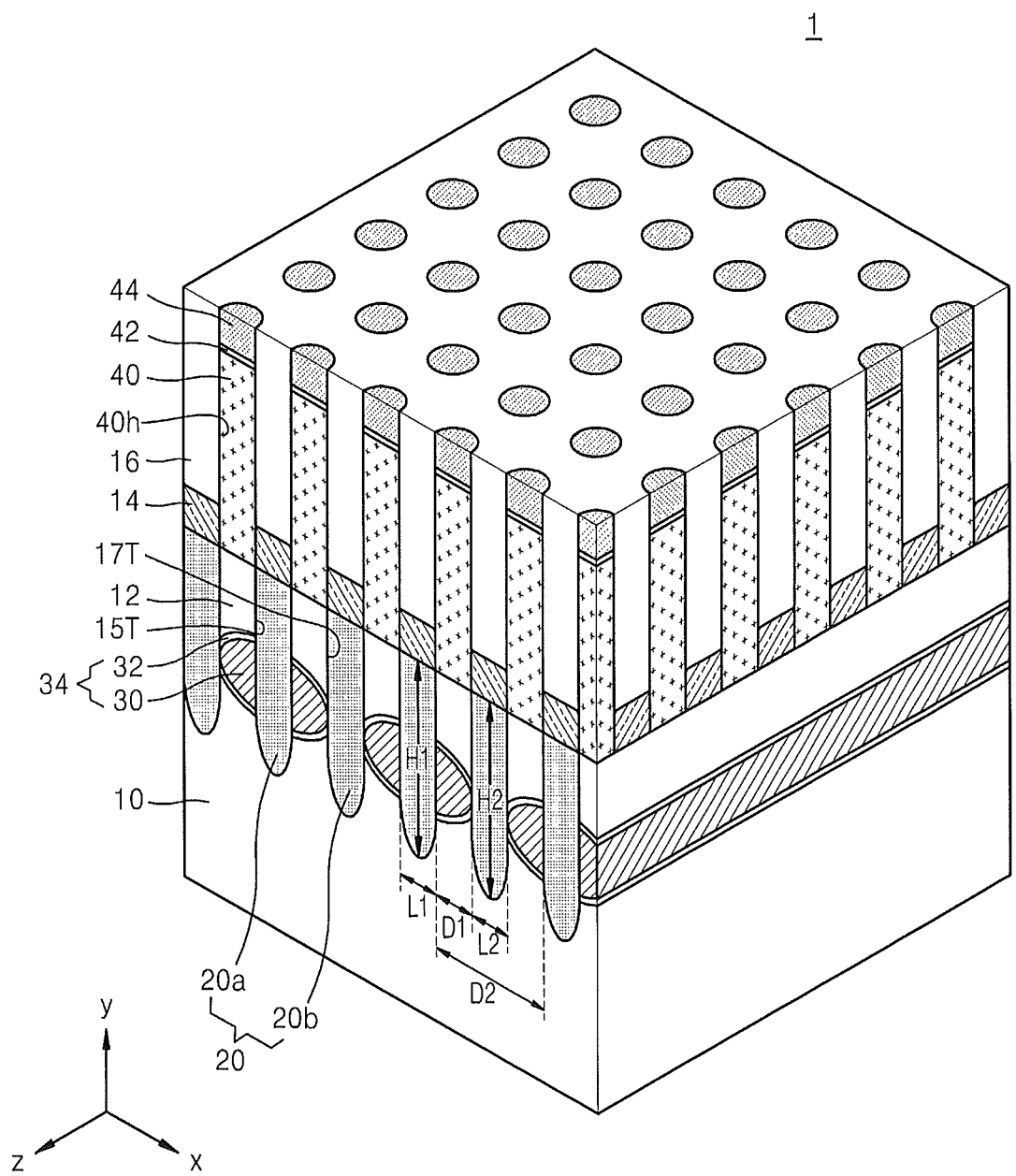
FIG. 2 is a schematic perspective view of a semiconductor device according to various embodiments of the inventive concept.

FIG. 2 is a schematic perspective view of a semiconductor device 1 according to various embodiments of the inventive concept.

Referring to FIG. 2, the semiconductor device 1 includes a plurality of device isolation films 20 formed in a substrate 10, a plurality of word lines 34 formed of a metal between the device isolation films 20, a first doped region 12 formed on the word lines 34, and a second doped region 40 formed on the first doped region 12.

The substrate 10 may be a dielectric layer that includes silicon oxide, titanium oxide, aluminum oxide, zirconium oxide, or hafnium oxide, a conductive layer that includes Ti, TiN, Al, Ta, TaN, and/or TiAlN, or a semiconductor layer that includes Si, SiGe, and/or SiC. Also, the substrate 10 may include an epitaxial layer, a silicon-on-insulator (SOI) layer, and/or a semiconductor-on-insulator (SEOI) layer.

The device isolation films 20 include a plurality of first device isolation films 20a alternating with a plurality of second device isolation films 20b.

The first device isolation films 20a and the second device isolation films 20b may be formed of insulating materials buried in first device isolation trenches 15T and second device isolation trenches 17T, respectively. The insulating materials may be, for example, an oxide, a nitride, or a combination of these materials.

The first device isolation films 20a and the second device isolation films 20b may have a line pattern extending in a direction, for example, in a z direction. The first device isolation films 20a and the second device isolation films 20b may be alternately disposed in a direction, for example, an x direction.

The first device isolation film 20a may have a first length L1 in the x direction. The first length L1 may be equal to a second length L2 of the second device isolation film 20b. The first device isolation film 20a may be separated by a first separation distance D1 from the directly adjacent second device isolation film 20b.

Also, the first device isolation film 20a may be separated by a second separation distance D2 from the directly adjacent first device isolation film 20a. The second separation distance D2 may be, for example, three times longer than the first separation distance D1. For example, the first length L1, the second length L2, and the first separation distance D1 may be equal. However, the distances according to the inventive concept are not limited thereto, and may vary.

Also, the first device isolation film 20a may have a first depth H1, that is, a distance from an upper surface of the first doped region 12 to a lower surface of the first device isolation film 20a. The first depth H1 may be equal to a second depth H2, which is a distance from the upper surface of the first doped region 12 to a lower surface of the second device isolation film 20b. According to various embodiments of the inventive concept, the first depth H1 may differ from the second depth H2.

The first device isolation films 20a may be formed by a shallow trench isolation (STI) process. Both side surfaces of the first device isolation films 20a may contact the word lines 34.

The second device isolation films 20b may be arranged by forming the second device isolation trenches 17T so that the second device isolation films 20b are self-aligned between the directly adjacent first device isolation films 20a. Each of the second device isolation films 20b may contact one of the word lines 34. However, the current embodiment is not limited thereto, that is, the second device isolation films 20b may not contact the word lines 34 but may be separated by a predetermined distance. An area on which the first device isolation films 20a contact the word lines 34 may be larger than an area on which the second device isolation films 20b contact the word lines 34, but the current inventive concept is not limited thereto. The second device isolation films 20b and the word lines 34 may be alternately formed. Also, the word lines 34 may be buried in the substrate 10 and may be formed lower than upper surfaces of the first device isolation films 20a and the second device isolation films 20b. Also, lower surfaces of the word lines 34 may be higher than the lower surfaces of the first device isolation films 20a and the second device isolation films 20b.

Also, the word lines 34 may each include a metal film 30 formed of a metal. A resistance of the word lines 34 may be reduced by forming the word lines 34 using a metal, and thus, power consumption of the semiconductor device 1 may be reduced. Also, the word lines 34 may further include a metal silicide film 32 that forms an ohmic-contact with the first doped region 12 and a metal film, such as, a tungsten film formed on the metal silicide film 32. The metal silicide film 32 may be formed by performing a heat treatment process onto the metal film 30. In this case, the metal silicide film 32 may vary according to the kind of metal material of the metal film 30.

The word lines 34 may be formed of a film selected from the group consisting of a Ti film, a Si film, a Ta film, a Mo film, a W film, a Ru film, a TiW film, a TiN film, a TiON film, a TiAlN film, a TiAlON film, a TiSiN film, a TiBN film, a WN film, a WON film, a WSiN film, a WBN film, a WCN film, a TaN film, a TaON film, a TaAlN film, a TaSiN film, a TaCN film, a MoN film, a MoSiN film, a MoAlN film, an NbN film, a ZrSiN film, a ZrAlN film, a TiC film, a TiCN film, a TiSi film, a TaSi film, a CoSi film, an NiSi film, a copper containing film, and a combination of these films.

The first doped region 12 formed on the word lines 34 may be formed by injecting dopants to a predetermined depth from an upper surface of the substrate 10. However, the formation of the first doped region 12 according to the current embodiment is not limited thereto. That is, the first doped region 12 in which dopants are injected may be formed on the substrate 10. For example, the first doped region 12 may be a region in which an N-type dopant is injected.

The first doped region 12 may have an upper surface that is coplanar with upper surfaces of the device isolation films 20. Also, the first doped region 12 may be formed after the word lines 34 are formed. However, the formation of the first doped region 12 is not limited thereto. That is the first doped region 12 may be formed before the word lines 34 are formed.

The second doped region 40 may be formed on the first doped region 12. The upper surface of the first doped region 12 may contact with a lower surface of the second doped region 40. The second doped region 40 may include a dopant having different conductive type from that of the first doped region 12. That is, the second doped region 40 may include a P-type dopant. The first doped region 12 and the second doped region 40 may constitute a diode.

The second doped region 40 may be formed by a selective epitaxial growing (SEG) method where the first doped region 12 may be used as a seed layer after forming through the hole 40h that exposes the upper surface of the first doped region 12 in an interlayer insulating film 16. The interlayer insulating film 16 may be formed of, for example, an oxide. However, the formation of the interlayer insulating film 16 is not limited thereto.

An etch-stop film 14 may be formed to expose the upper surface of the first doped region 12 and to cover the first device isolation films 20a and the second device isolation films 20b. Since the first doped region 12 is not covered by the etch-stop film 14 but exposed, the second doped region 40 may be formed on the first doped region 12 by using an SEG method. The first doped region 12 and the second doped region 40 may have the same crystallization direction. The etch-stop film 14 may be formed of an oxide, a nitride formed on the oxide, or a nitride only.

A contact plug 42 may be formed between the second doped region 40 and a lower electrode 44. The contact plug 42 may be a metal silicide film that forms an ohmic contact with the second doped region 40, such as a CoSi film, a TiSi film, an IrSi film, a PtSi film, or an NiSi film, or a metal film, such as a tungsten film, formed on the metal silicide film.

The lower electrode 44 may be electrically connected to the word lines 34 through the second doped region 40 and the first doped region 12.

According to the current inventive concept, since the word lines 34 that each include the metal film 30 are formed between the first device isolation films 20a and the second device isolation films 20b, the second device isolation trenches 17T for forming the second device isolation films 20b may be stably formed without falling down. Accordingly, when minute patterns are formed, the structural reliability of the semiconductor device 1 may be increased. Also, since the word lines 34 are formed higher than the lower surfaces of the first and second device isolation films 20a and 20b between the first device isolation films 20a and the second device isolation films 20b, a high breakdown voltage may be secured by the semiconductor device 1.

Figure 3:
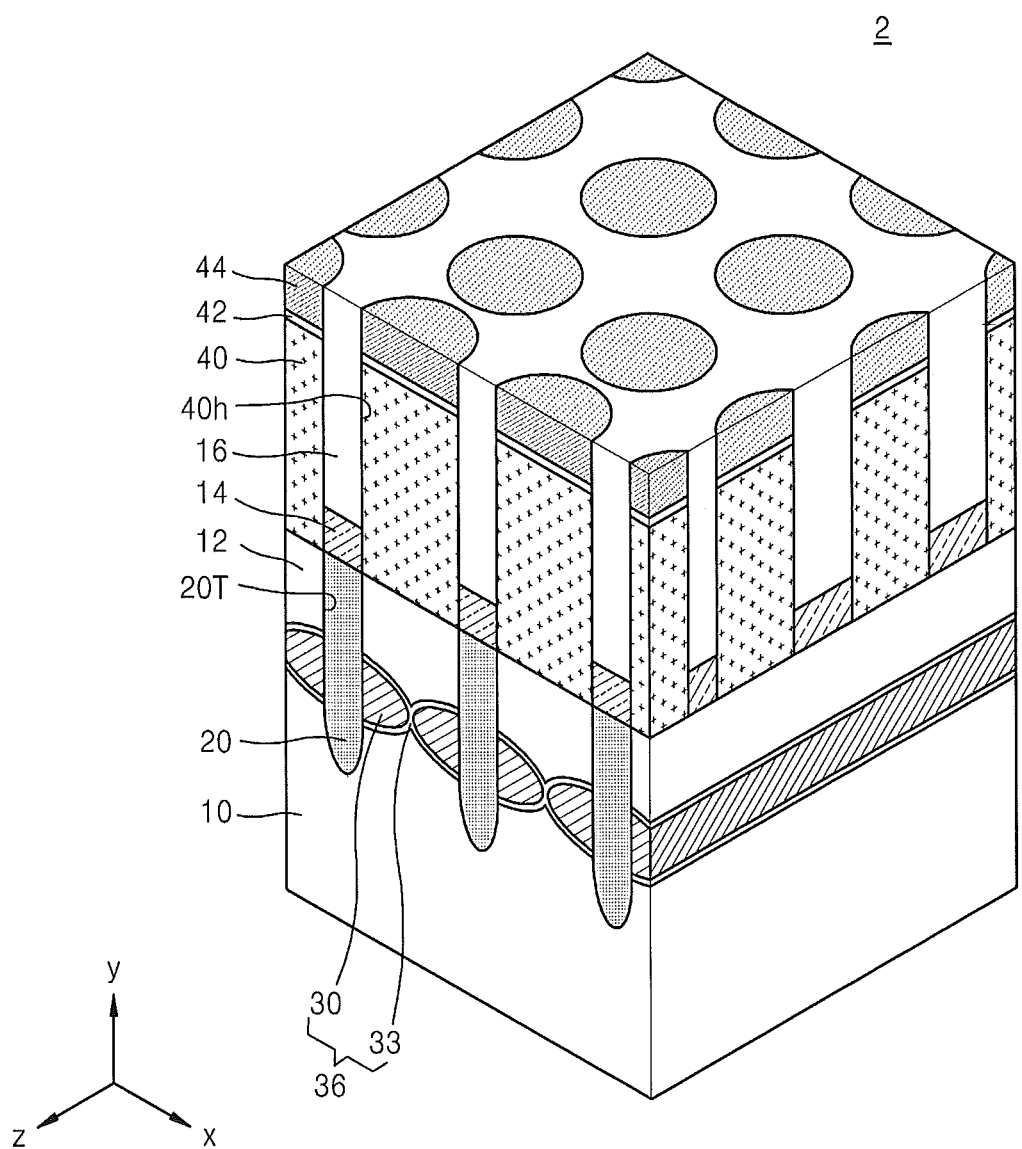
FIG. 3 is a schematic perspective view of a semiconductor device according to various embodiments of the inventive concept.

FIG. 3 is a schematic perspective view of a semiconductor device 2 according to various embodiments of the inventive concept.

Referring to FIG. 3, unlike the semiconductor device 1 described with reference to FIG. 2, two metal films 30 formed between two directly adjacent device isolation films 20 may form one word line 36 by electrically connecting to each other via the metal silicide film 33.

That is, because a minute pattern is not required like in the semiconductor device 1, a method of forming the semiconductor device 2 of FIG. 3 may omit the process for forming the second device isolation film 20b of FIG. 2, and the metal silicide film 33 that electrically connects the two metal films 30 may be formed by performing a heat treatment process onto the two metal films 30 separated from each other. The word line 36 may include the metal films 30 and the metal silicide films 33, and may be electrically connected to the first doped region 12.

FIGS. 4 through 17 are cross-sectional views for explaining a method of manufacturing a semiconductor device, according to various embodiments of the inventive concept. In the current embodiment, a method of manufacturing the semiconductor device 1 of FIG. 2 is described. Like reference numerals denote like elements in FIG. 2, and thus, descriptions thereof are not repeated.

Figure 4:
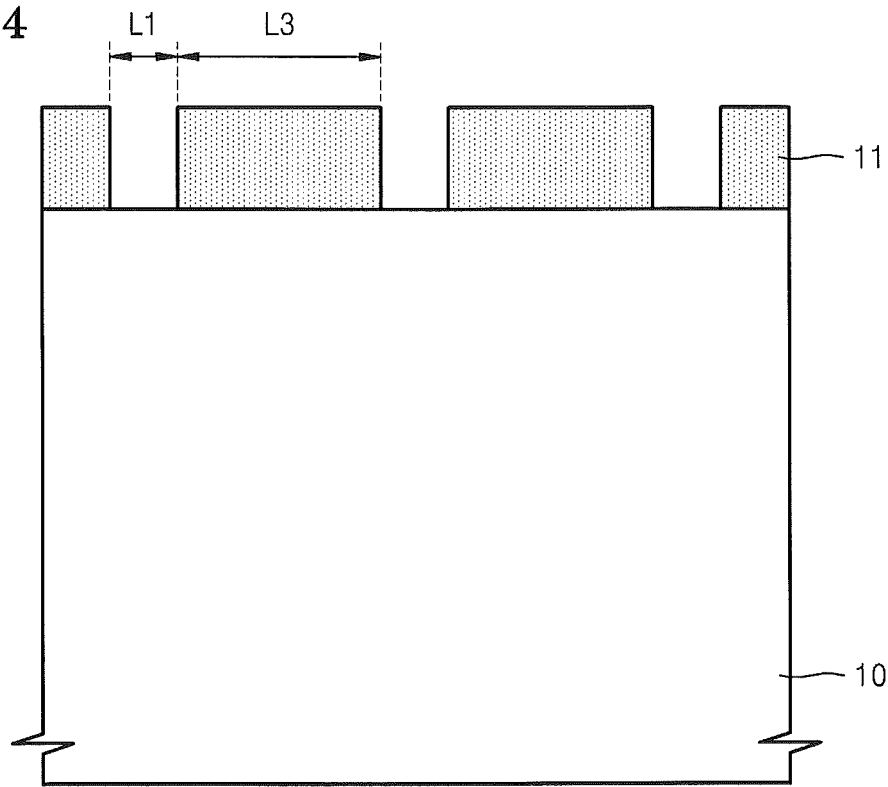
FIGS. 4 through 17 are cross-sectional views for explaining a method of manufacturing a semiconductor device according to various embodiments of the inventive concept.

Referring to FIG. 4, the substrate 10 is prepared.

A mask 11 for forming trenches 13T (refer to FIG. 5) is formed on the substrate 10. The mask 11 may be patterned by a photolithography process. The mask 11 may be formed of an oxide, a nitride, or a combination of these materials. The mask 11 may be a composite film of, for example, a buffer oxide film, a trench liner nitride film, and a buried oxide film. Also, the mask 11 may be one of a high temperature oxide (HTO), a high density plasma (HDP) oxide, a tetra ethyl orthosilicate (TEOS), a boro-phospho-silicate glass (BPSG), or a undoped silicate glass (USG). However, the mask 11 according to the current inventive concept is not limited thereto. The mask 11 may be formed to have a region having a first length L1 on which an etch process is performed and a region having a third length L3 on which an etch process is not performed. For example, the first length L1 and the third length L3 may have a width ratio of 1:3. However, the ratio may vary according to the positions of the word lines 34.

Figure 5:
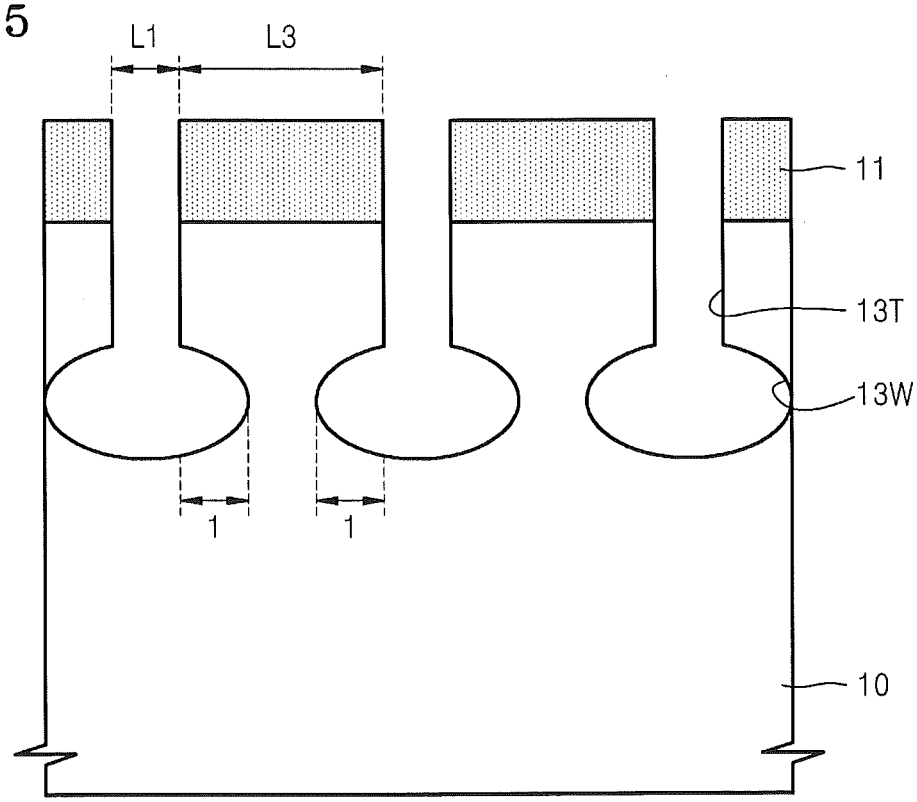

Referring to FIG. 5, the trenches 13T are formed by etching the substrate 110 using the mask 11.

Side trenches 13W are formed by side etching the lower parts of the trenches 13T in order to form cavities for word lines formation regions.

The trenches 13T may be formed by an anisotropic etching process and the side trenches 13W may be formed by an isotropic etching process. The anisotropic etching may be, for example, plasma etching. However, the etching of the trenches 13T and the side trenches 13W is not limited thereto.

Figure 6:
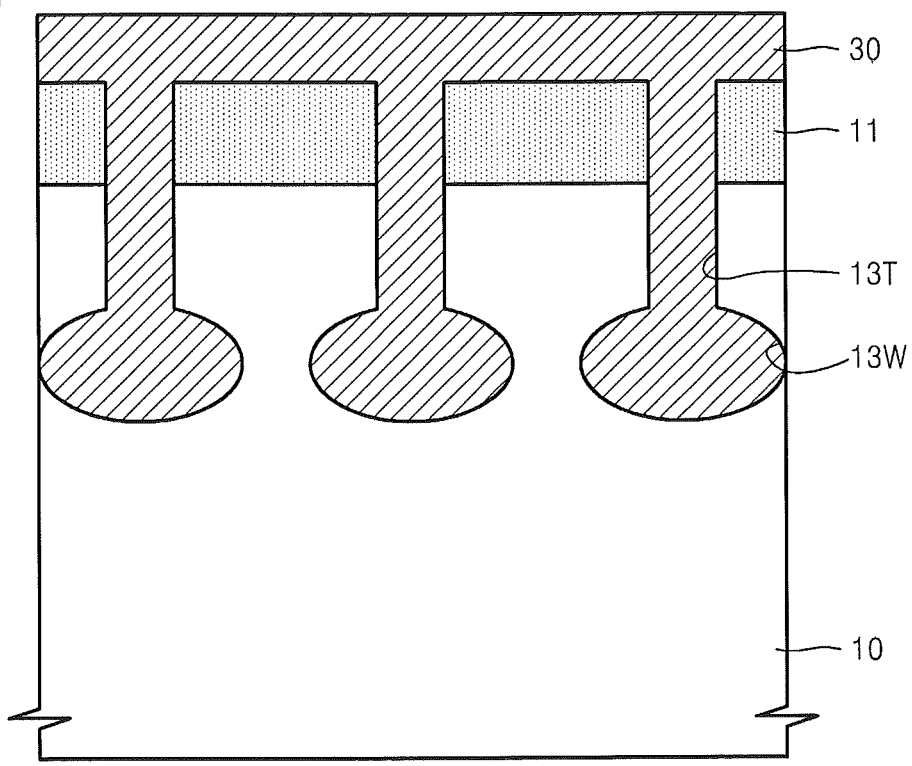
Figure 7:
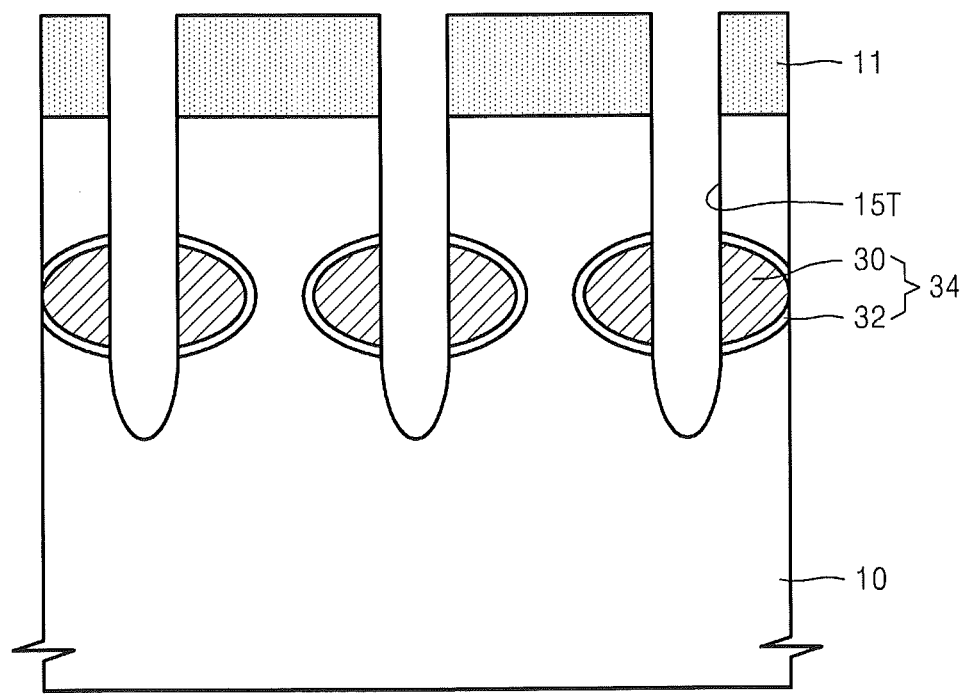

Referring to FIGS. 6 and 7, in order to form the word lines 34 in the side trenches 13W, a metal film 30 is formed in the trenches 13T and the side trenches 13W. Forming the metal film 30 may result in forming a plurality of metal patterns in respective ones of the side trenches 13W.

The metal film 30 may be formed by using, for example, a chemical vapor deposition (CVD) method, a physical vapor deposition (PVD) method, or an atomic layer deposition (ALD) method. However, the formation of the metal film 30 is not limited thereto.

The metal film 30 may be formed of a material selected from the group consisting of Ti, Si, Ta, Mo, W, Ru, TiW, TiN, TiON, TiAlN, TiAlON, TiSiN, TiBN, WN, WON, WSiN, WBN, WCN, TaN, TaON, TaAlN, TaSiN, TaCN, MoN, MoSiN, MoAlN, NbN, ZrSiN, ZrAlN, TiC, TiCN, TiSi, TaSi, CoSi, NiSi, a copper-containing material, and a combination of these materials.

The metal film 30 formed on the mask 11 may be removed by an isotropic etching process.

First device isolation trenches 15T for forming first device isolation films 20a (refer to FIG. 9) are formed by an anisotropic etching, and at the same time, the metal film 30 may be divided into separate the word lines 34 by the first device isolation trenches 15T.

The word line 34 may further include a metal silicide film 32. The metal silicide film 32 may be formed by a heat treatment process on the metal film 30. The metal silicide film 32 may vary according to the kind of metal material for forming the metal film 30.

A heat treatment is described as an example for a method of forming the metal silicide film 32. However, the method of forming the metal silicide film 32, according to the current inventive concept is not limited thereto. That is, after forming the metal silicide film 32 in the trench 13T and the side trench 13W, the metal film 30 may be formed on the metal silicide film 32, and afterwards, the first device isolation trench 15T may be formed to divide the metal film 30. Accordingly, the word line 34 may be formed.

Figure 8:
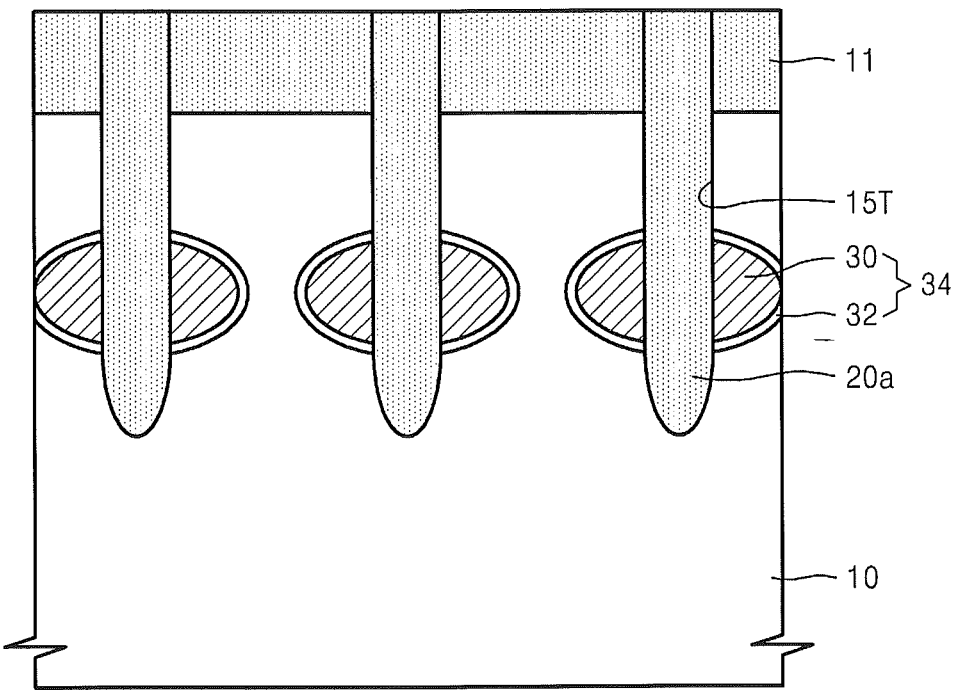

Referring to FIG. 8, a plurality of first device isolation films 20a may be formed by depositing an insulating material in the first device isolation trenches 15T. The plurality of first device isolation films 20a may be formed self-aligned to respective ones of the first device isolation trenches 15T.

The first device isolation film 20a may be formed by, for example, a CVD method, a PVD method, or an ALD method.

The first device isolation film 20a may be formed of an oxide, a nitride, or a combination of these materials. The first device isolation film 20a may be, for example, a composite film including a buffer oxide film, a trench liner nitride film, and a buried oxide film. Also, the first device isolation films 20a may be one of an HTO, an HDP oxide, a TEOS, a BPSG, or a USG.

Figure 9:
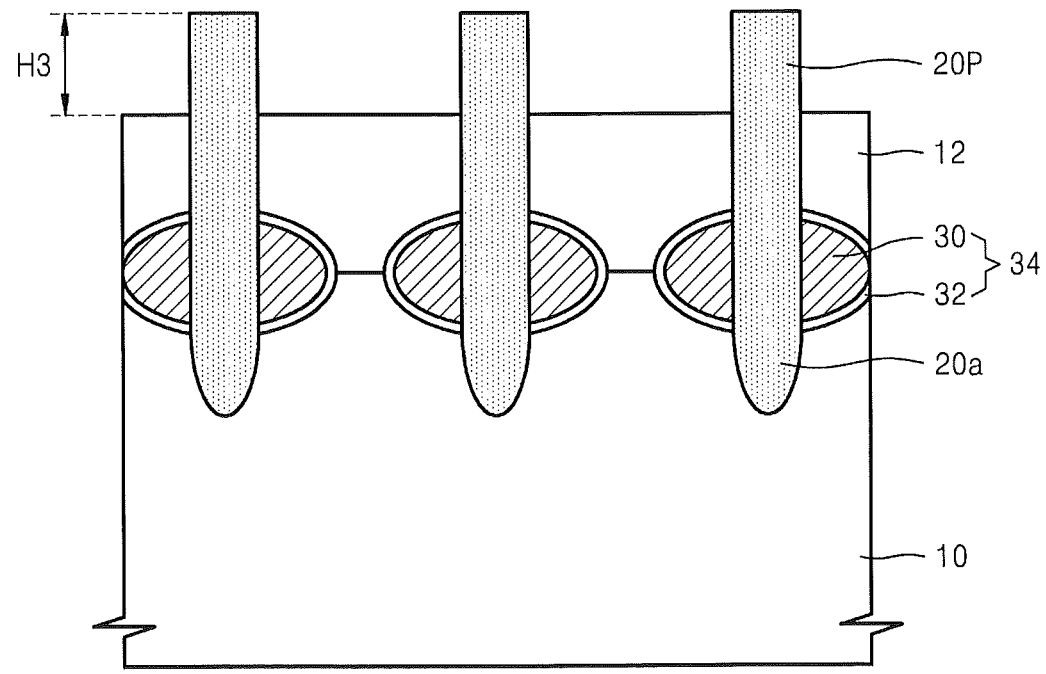

Referring to FIGS. 8 and 9, a planarizing process is performed to expose the upper surface of the substrate 10. The planarizing process may be a chemical mechanical polishing (CMP) process.

An upper part of the substrate 10 is selectively removed by performing an anisotropic etching process. Due to the anisotropic etching process, the first device isolation films 20a may include protrusion units 20P protruding by a predetermined height H3 above the substrate 10.

The height H3 may determine a height of spacers 15S in a spacer 15S formation operation which will be described below with reference to FIG. 11. The height H3 may be, for example, two to five times greater than the first length L1 of FIG. 4.

The method of forming the protrusion units 20P according to the current inventive concept is not limited thereto. That is, the protrusion units 20P may be formed such that, after performing an isotropic etching process to remove the mask 11 and a portion of the first device isolation films 20a, a portion of the upper part of the substrate 10 may be removed through an anisotropic etching process. The mask 11 and the first device isolation films 20a may be formed of the same material so that the upper part of the substrate 10 is exposed through the isotropic etching process.

A first doped region 12 is formed by injecting a dopant into an exposed upper surface of the substrate 10. The dopant may be, for example, an n-type dopant.

The first doped region 12 may be formed after the word lines 34 are formed. However, the formation of the first doped region 12 is not limited thereto. That is, the first doped region 12 may be formed by injecting a dopant into the substrate 10 before forming the mask 11 (refer to FIG. 4) after preparing the substrate 10.

Figure 10:
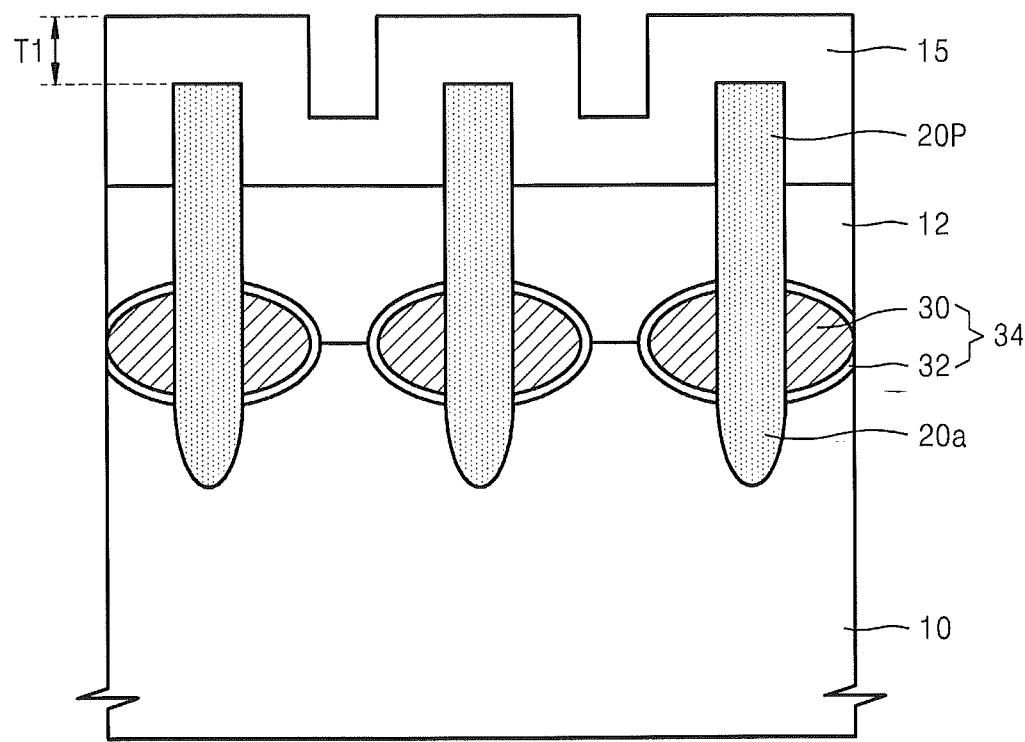
Figure 11:
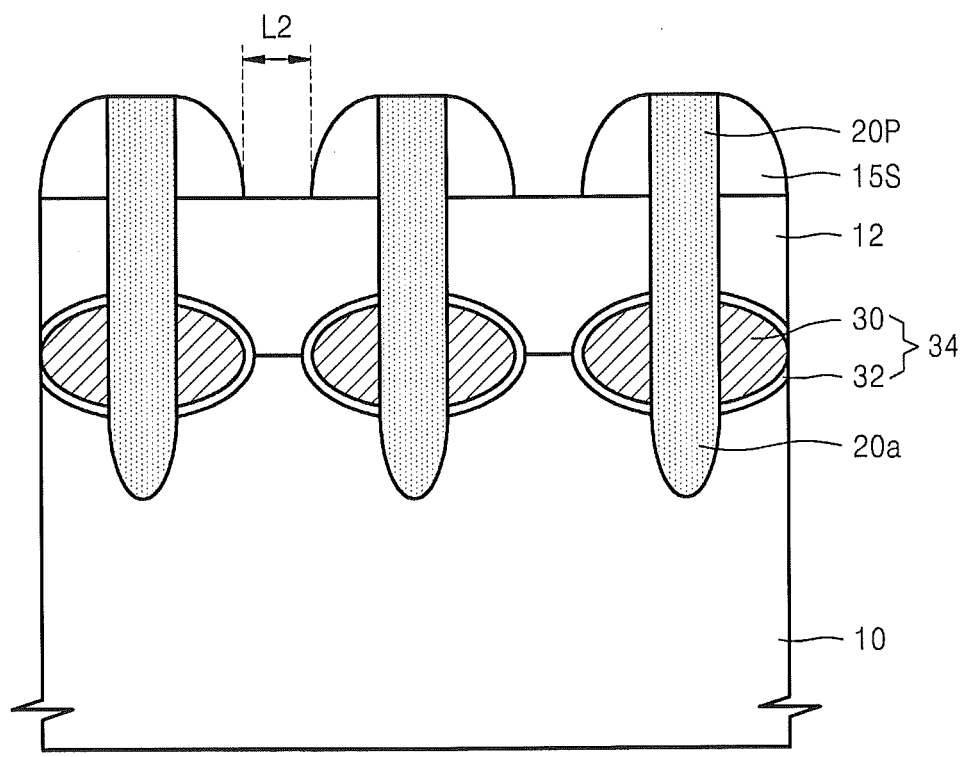

Referring to FIGS. 10 and 11, a spacer material layer 15 is formed to cover an exposed surface of the first doped regions 12 and the protrusion units 20P of the first device isolation films 20a.

The spacer material layer 15 may be formed of a material having a high etch-selectivity ratio or a high etch-selectivity with respect to the first doped region 12 and the first device isolation films 20a. The etch-selectivity may be quantitatively expressed through a ratio of an etching speed of a layer to that of another layer. The spacer material layer 15 may be formed of, for example, a silicon oxide or a silicon nitride. For example, when the first device isolation films 20a are an oxide film, the spacer material layer 15 may be a silicon nitride film. An ALD process may be used to form the spacer material layer 15 on the first doped region 12 with a uniform thickness, but the current inventive concept is not limited thereto.

The thickness T1 of the spacer material layer 15 may determine the size of second device isolation trenches 17T in a process of forming the second device isolation trenches 17T which will be described below with reference to FIG. 12. In various embodiments, the thickness T1 of the spacer material layer 15 may be formed the same as the first length L1 (refer to FIG. 4) of the first device isolation films 20a. According to various embodiments, the thickness T1 of the spacer material layer 15 may be formed smaller than the length L1 of the first device isolation films 20a.

Referring to FIG. 11, the spacers 15S may be formed by removing a portion of the spacer material layer 15. The portion of the spacer material layer 15 may be removed by performing an etch-back process so that the upper surfaces of the first device isolation films 20a and a portion of the first doped region 12 between the first device isolation films 20a are exposed. And thus, the spacers 15S may be formed on both sidewalls of the first device isolation films 20a.

The spacers 15S may be used as etch masks for forming the second device isolation trenches 17T in a subsequent process. Second lengths L2 of the substrate 10 exposed through the spacers 15S may correspond to the size of the second device isolation trenches 17T.

Figure 12:
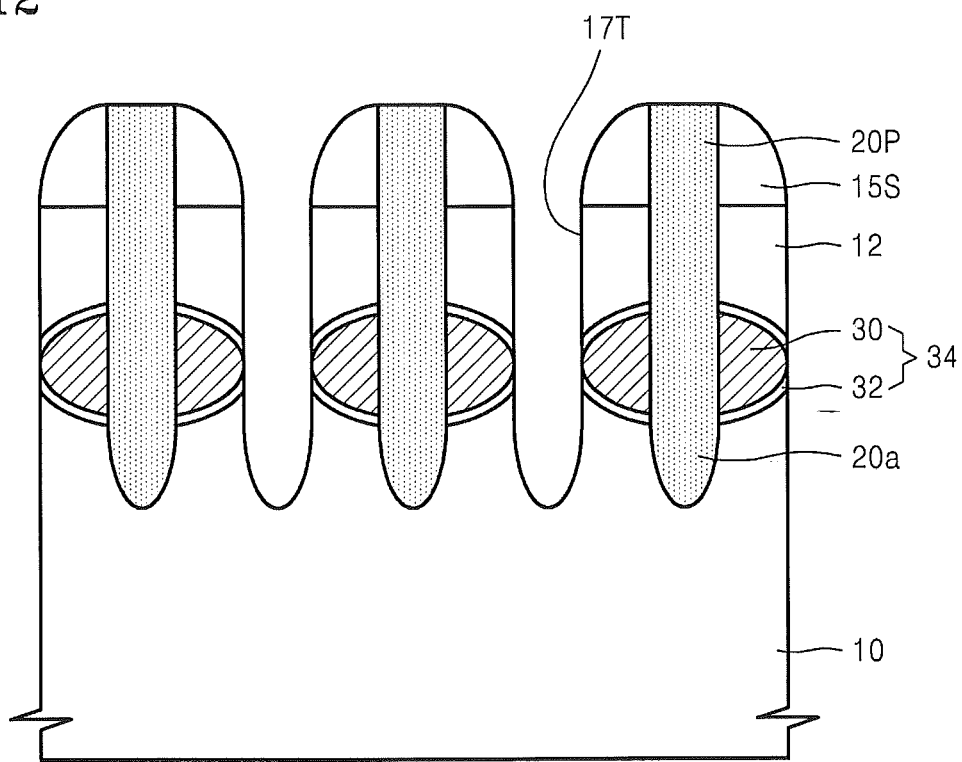

Referring to FIG. 12, the second device isolation trenches 17T are formed by etching the exposed first doped region 12 and the substrate 10 using the spacers 15S and protrusion units 20P as etch masks so that a side surface of the word line 34 may be exposed.

In various embodiments, the second device isolation trenches 17T may be formed separately from the word lines 34 by a predetermined distance. In that case, the word lines 34 may not contact the second device isolation trenches 17T.

Also, in the above etching process, the heights of the spacers 15S and the protrusion units 20P may be reduced due to the etching. Accordingly, the height of the spacers 15S and the protrusion height of the protrusion units 20P, which are determined in a precedent process, may be determined in consideration of the thickness that may be removed in the above etching process. For example, as the aspect ratio of the second device isolation trenches 17T is larger, the heights of the spacers 15S and the protrusion units 20P may be determined to be higher.

In the current process, since the separated word lines 34 are disposed on both side surfaces of the second device isolation trenches 17T, tilting of the pattern of the substrate 10 may be prevented in the process of forming the second device isolation trenches 17T.

Figure 13:
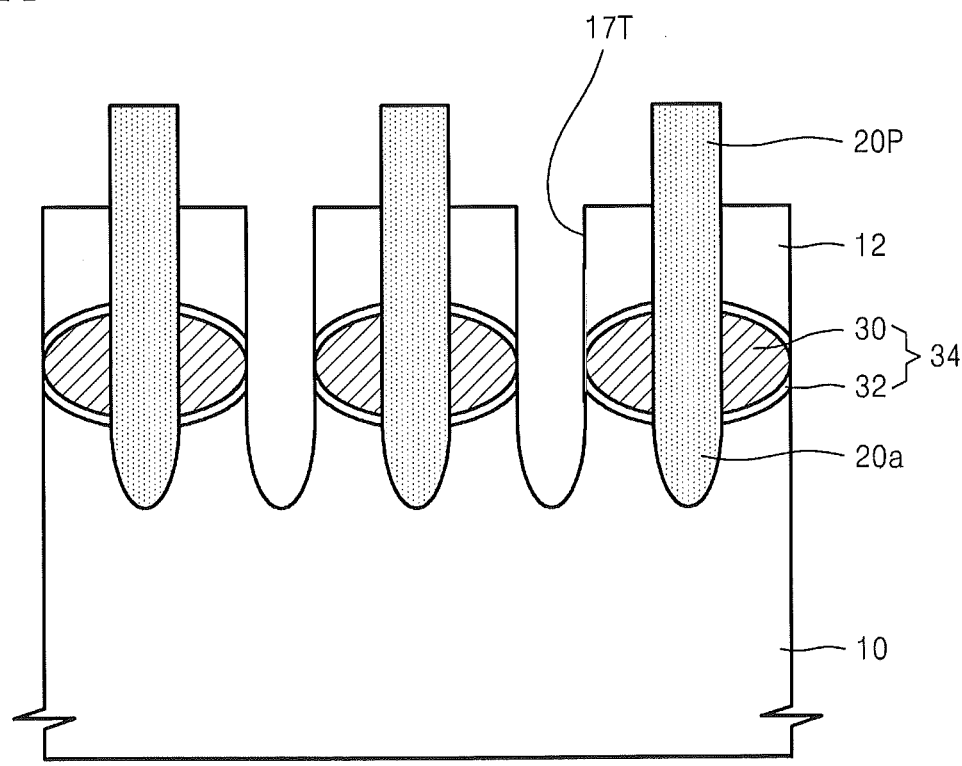

Referring to FIG. 13, a process of removing the spacers 15S is performed. In the removing process, the spacers 15S may be selectively removed by, for example, an anisotropic etching process.

Figure 14:
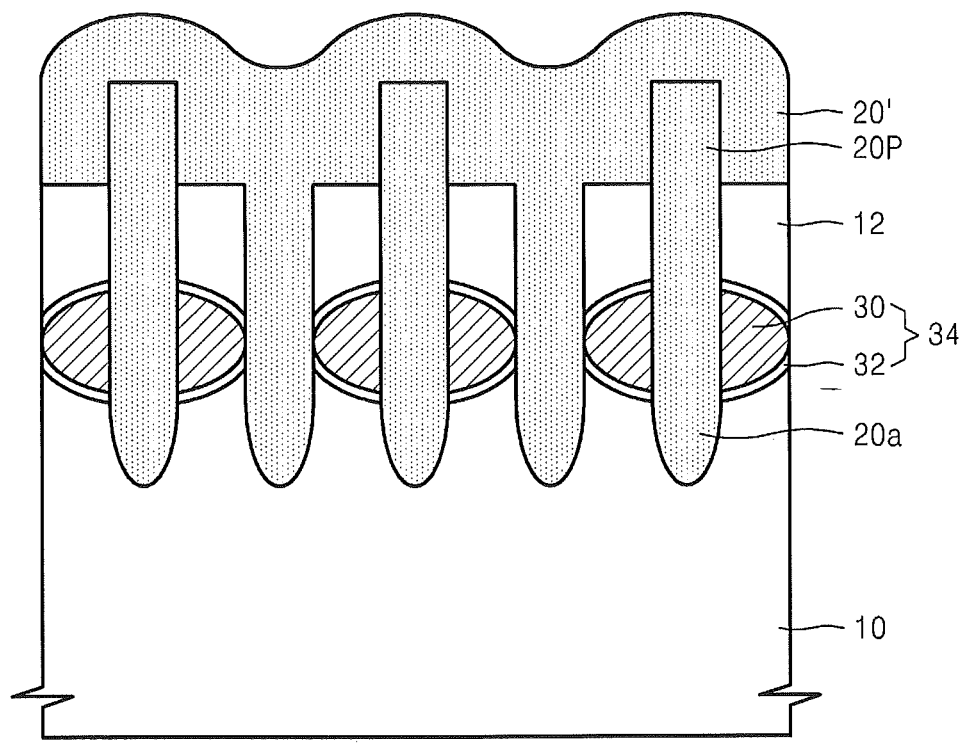

Referring to FIG. 14, an insulating material layer 20' that buries the second device isolation trenches 17T is deposited.

The insulating material layer 20' may be formed of the same material used to form the first device isolation films 20a described with reference to FIG. 8. For example, the insulating material layer 20' may be formed of an oxide, a nitride, or a combination of these materials. In various embodiments, the insulating material layer 20' may be formed of a material different from the material used to form the first device isolation films 20a. The insulating material layer 20' may be deposited using the same method used to deposit the first device isolation films 20a. For example, the insulating material layer 20' may be formed by a CVD method, a PVD method, or an ALD method.

Figure 15:
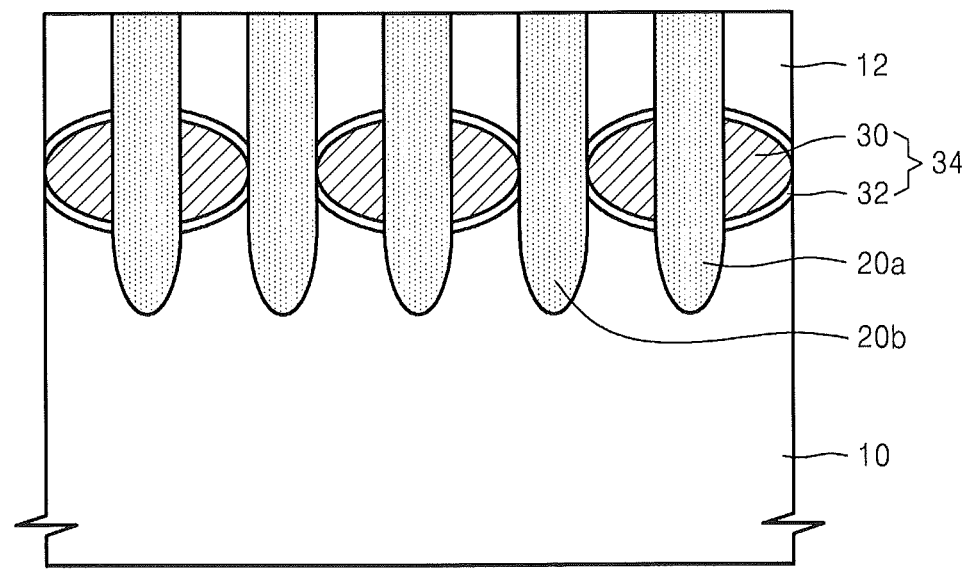

Referring to FIGS. 14 and 15, the insulating material layer 20' on the first doped region 12 and the protrusion units 20P on the first device isolation films 20a may be removed so that the first doped regions 12 between the first device isolation films 20a and the second device isolation films 20b are exposed.

As a result, the first device isolation films 20a and the second device isolation films 20b are alternately disposed. Also, the word lines 34 may be disposed between the first device isolation films 20a and the second device isolation films 20b, and the first doped region 12 respectively may be disposed on the word lines 34.

Figure 16:
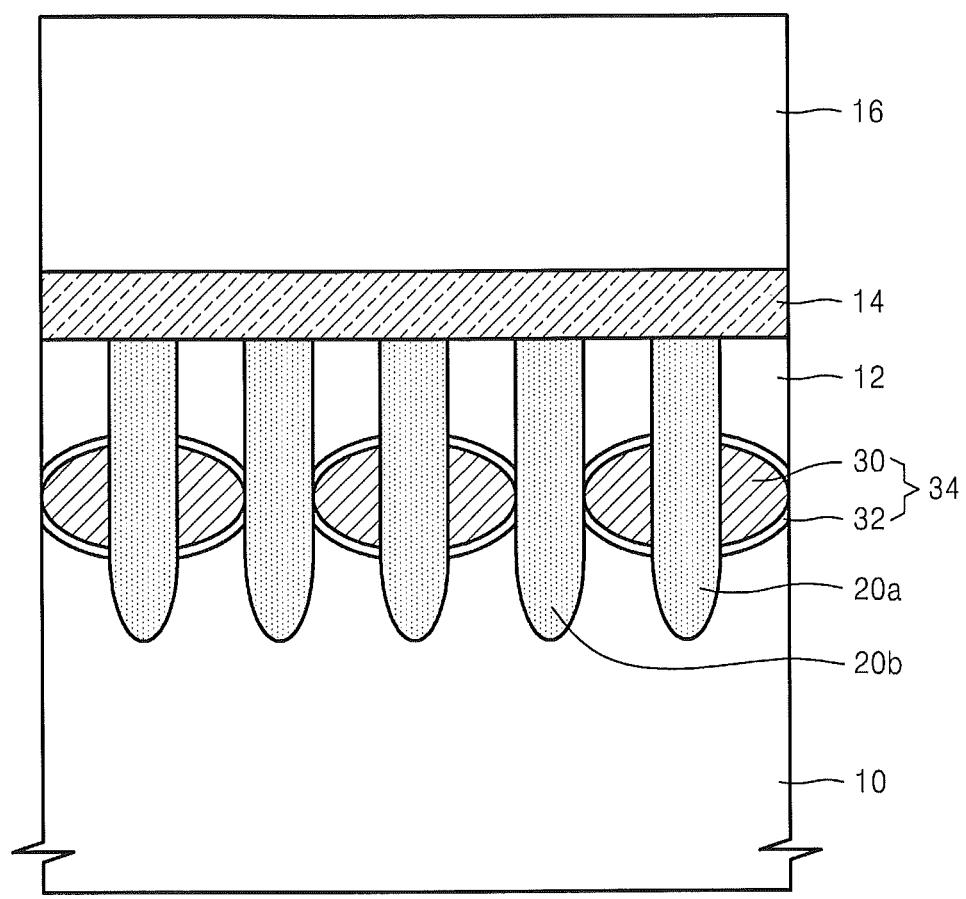

Referring to FIG. 16, an etch-stop film 14 is formed to cover the first doped region 12, the first device isolation films 20a, and the second device isolation films 20b, and an interlayer insulating film 16 is formed on the etch-stop film 14.

The etch-stop film 14 may be formed by depositing an insulating material selected from the group consisting of SiOx, SixNy, SiON, SiON, SiCN, SiC, C, TiO, ZrOx, MgOx, HfOx, and AlOx.

The interlayer insulating film 16 may be formed of a material having an etch-selectivity with the etch-stop film 14. For example, the interlayer insulating film 16 is formed of an oxide, the etch-stop film 14 may be formed of a nitride, or an oxide and a nitride formed on the oxide.

Figure 17:
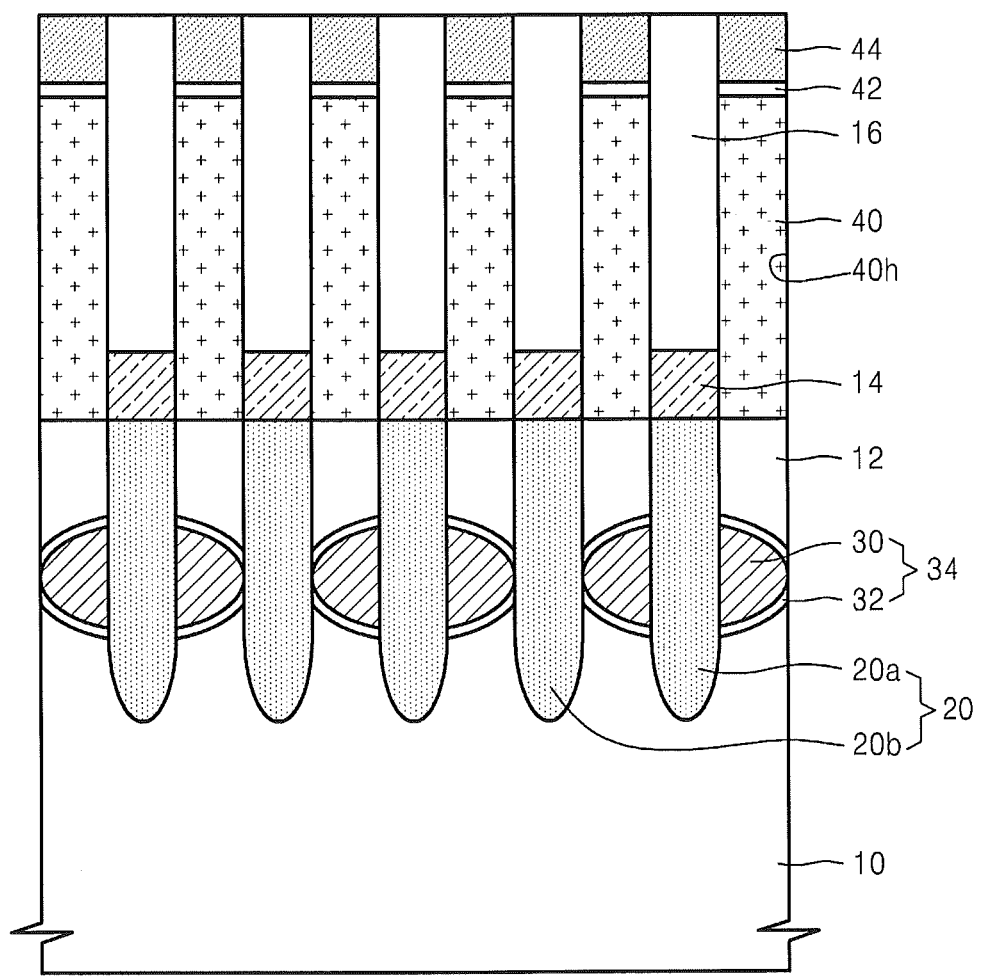

Referring to FIG. 17, through holes 40h for forming second doped regions 40 are formed by performing an etching process in the interlayer insulating film 16 until the upper surface of the first doped region 12 is exposed. In the etching process, the etch-stop film 14 formed on the first doped region 12 is removed. The etching process may be an anisotropic etching process.

The second doped region 40 is formed on the first doped region 12 by using an SEG method that uses the first doped region 12 as a seed and by injecting dopants. The dopant maybe a p-type dopant. The first doped region 12 and the second doped region 40 may constitute a diode.

A contact plug 42 and a lower electrode 44 are sequentially formed on the second doped region 40. The contact plug 42 may include a metal silicide film formed of, such as CoSi, TiSi, IrSi, PtSi, or NiSi, which forms an ohmic contact with the second doped region 40 and a metal film such as tungsten formed on the metal silicide film.

The lower electrode 44 may be electrically connected to the word line 34 through the contact plug 42, the second doped region 40, and the first doped region 12.

According to the current inventive concept, since the word lines 34 that are separated from each other may be formed by forming the first device isolation trenches 15T, the process of forming the word lines 34 is simplified. Also, since the separated word lines 34 are respectively disposed on both side surfaces of the second device isolation trenches 17T, uniform second device isolation trenches 17T without tilt may be formed.

Also, since the word lines 34 are formed of a metal, a resistance of the semiconductor device 1 may be reduced. Also, since the first doped region 12 is formed on the word lines 34, the second doped region 40 may be formed on the first doped region 12 by using an SEG method.

FIGS. 18 through 30 are cross-sectional views for explaining a method of manufacturing a semiconductor device, according to various embodiments of the inventive concept. In the current embodiment, a method of manufacturing the semiconductor device 1 of FIG. 2 is described. In FIGS. 18 through 30, like reference numerals are used to indicate elements that are substantially identical to the elements of FIGS. 4 through 17, and thus, a detailed description thereof will not be repeated.

Figure 18:
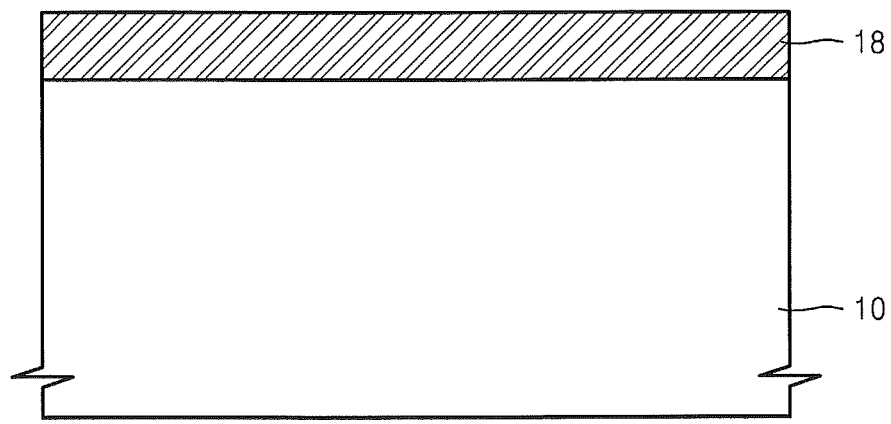
FIGS. 18 through 30 are cross-sectional views for explaining a method of manufacturing a semiconductor device, according to various embodiments of the inventive concept.

Referring to FIG. 18, a sacrificial film 18 is formed on the substrate 10. The sacrificial film 18 may comprise an insulating material, for example, a nitride. However, the sacrificial film 18 according to the current inventive concept is not limited thereto.

Figure 19:
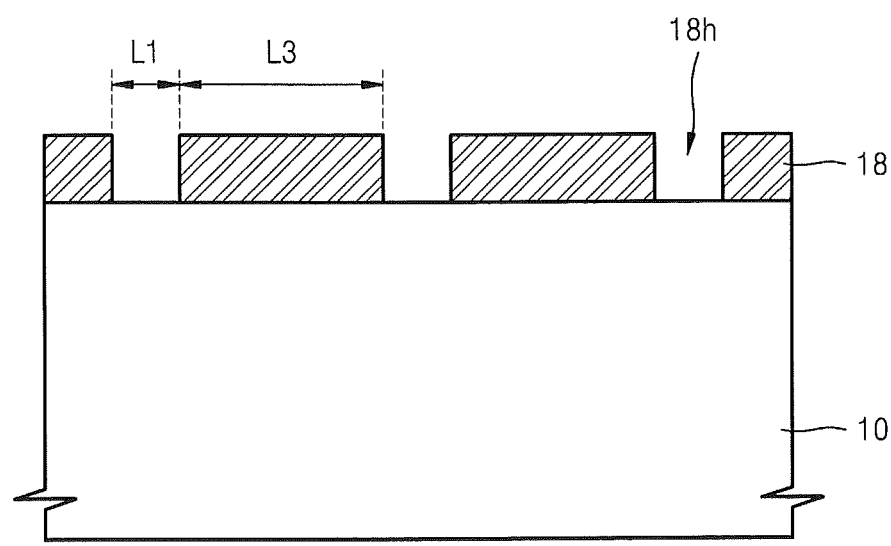

Referring to FIG. 19, holes 18h for forming an epitaxial layer 22' by using an SEG method on the substrate 10 are formed in the sacrificial film 18 to expose an upper surface of the substrate 10. The sacrificial film 18 may be formed to have a region having a first length L1 on which an etching process is performed and a region having a third length L3 on which the etching process is not performed. For example, the first length L1 and the third length L3 may have a width ratio of 1:3. However, the ratio may vary according to the positions of the word lines 34.

Figure 20:
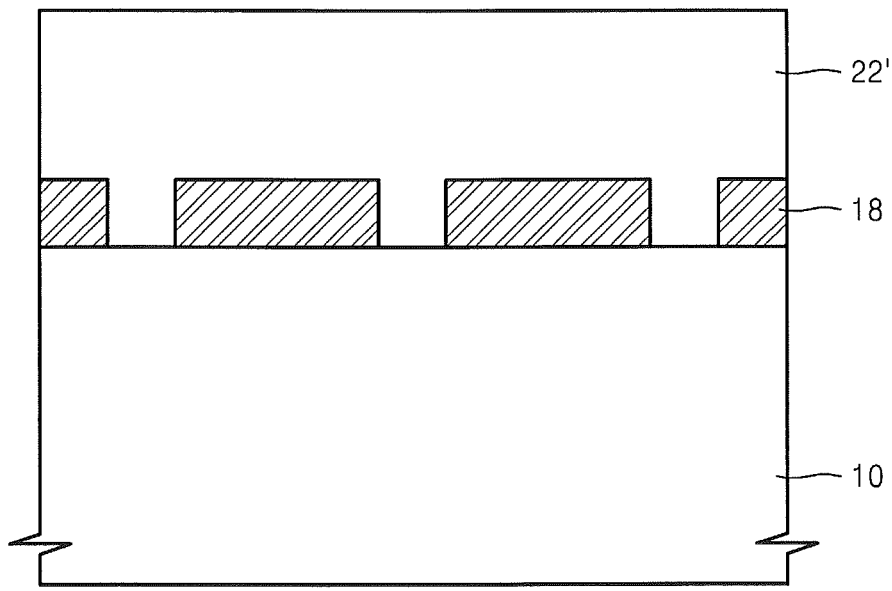

Referring to FIG. 20, the epitaxial layer 22' is formed by using an SEG method from the exposed upper surface of the substrate 10.

Figure 21:
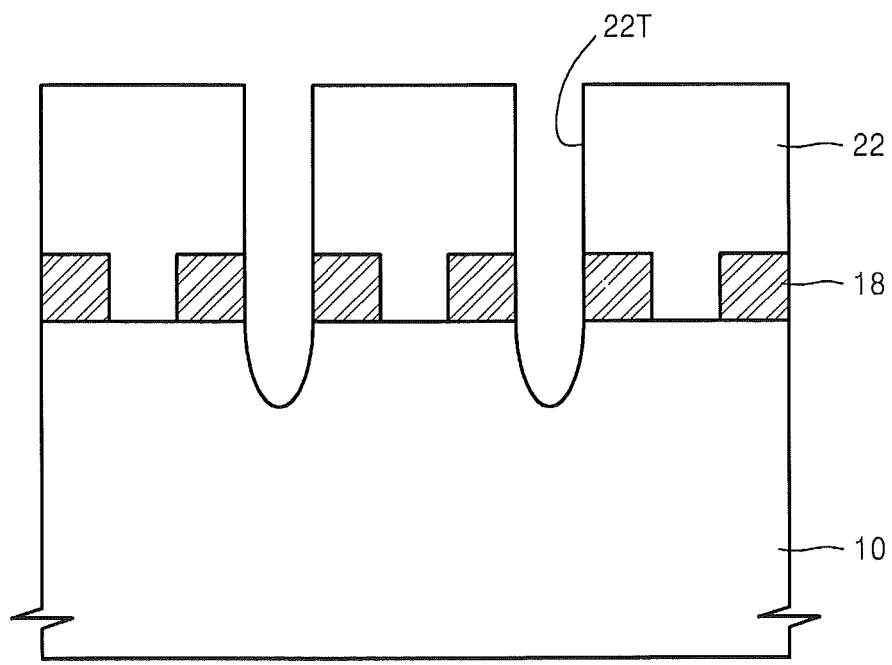

Referring to FIGS. 20 and 21, a first doped region 22 is formed by injecting a dopant into the epitaxial layer 22'. The first doped region 22 may include an n-type dopant.

First device isolation trenches 22T that penetrate through the first doped region 22, the sacrificial film 18, and a portion of the substrate 10 are formed.

Figure 22:
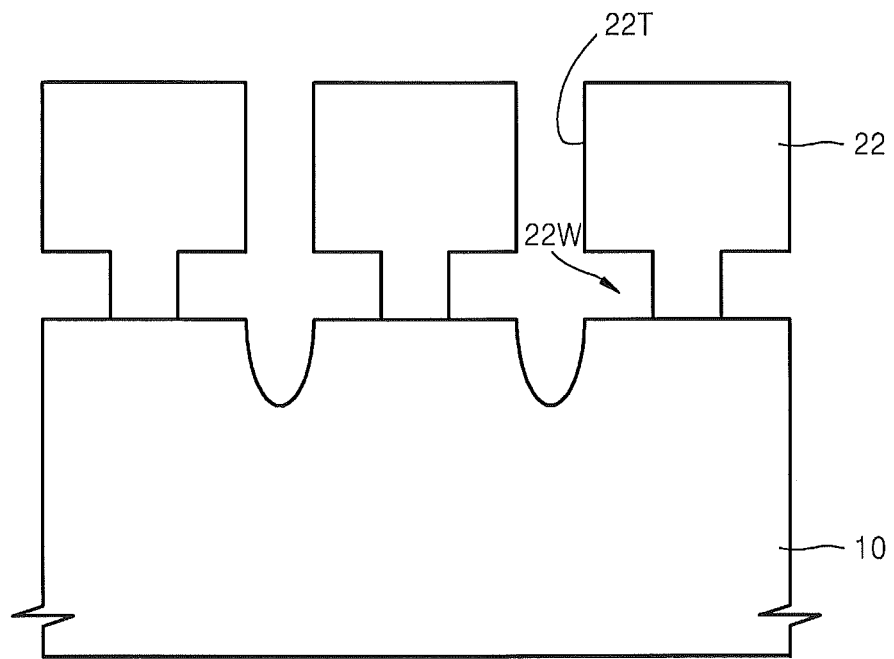

In the process of forming the first device isolation trenches 22T, the sacrificial film 18 may be divided by predetermined distances. The first device isolation trenches 22T may expose sidewalls of the sacrificial film 18. Referring to FIGS. 21 and 22, side trenches 22W are formed by selectively removing the sacrificial film 18 exposed in the first device isolation trenches 22T. The side trenches 22W are cavities for forming the word lines 34 (refer to FIG. 25), and may be formed by an anisotropic etching method.

Figure 23:
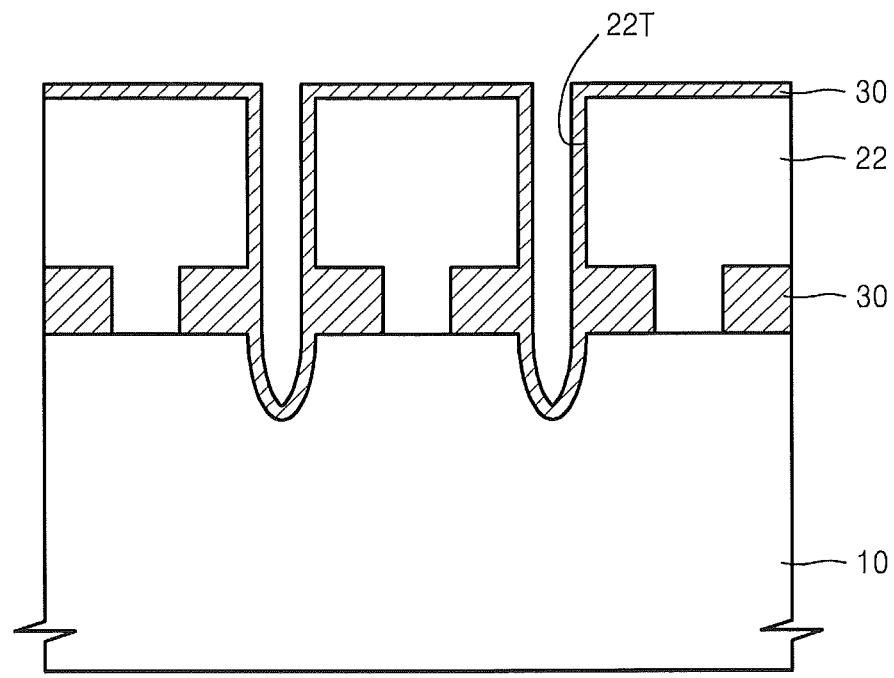

Referring to FIGS. 22 and 23, a metal film 30 is deposited on the side trenches 22W and the first device isolation trenches 22T so that the side trenches 22W are buried by a metal.

The metal film 30 may be formed by, for example, a CVD method, a PVD method, or an ALD method. The method of forming the metal film 30 according to the current inventive concept is not limited thereto.

Figure 24:
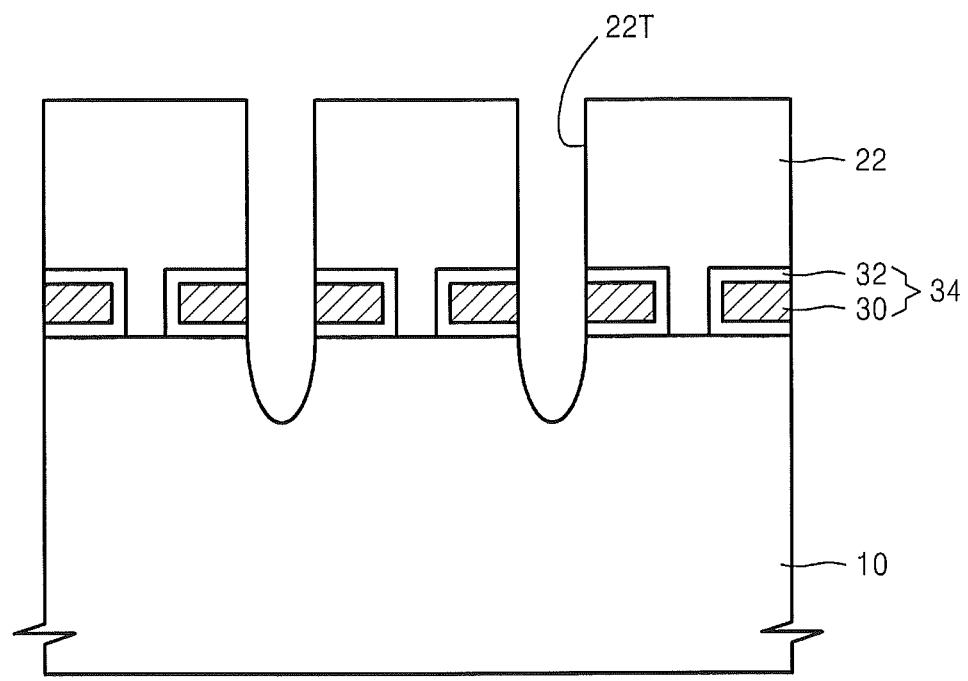

Referring to FIGS. 23 and 24, the word lines 34 are formed in the side trenches 22W by selectively removing the metal film 30 formed on the first device isolation trenches 22T. In the current process, the resistance of the word lines 34 may be reduced by forming the word lines 34 using the metal film 30 formed on the side trenches 22W. Also, due to the formation of the word lines 34, the tilt of second device isolation trenches 24T (refer to FIG. 29) in a process of forming the second device isolation trenches 24T may be prevented. Accordingly, the structural stability of the semiconductor device 1 may be increased.

Also, the word lines 34 may further include a metal silicide film 32 and a metal film, such as a tungsten film, formed on the metal silicide film 32.

Figure 25:
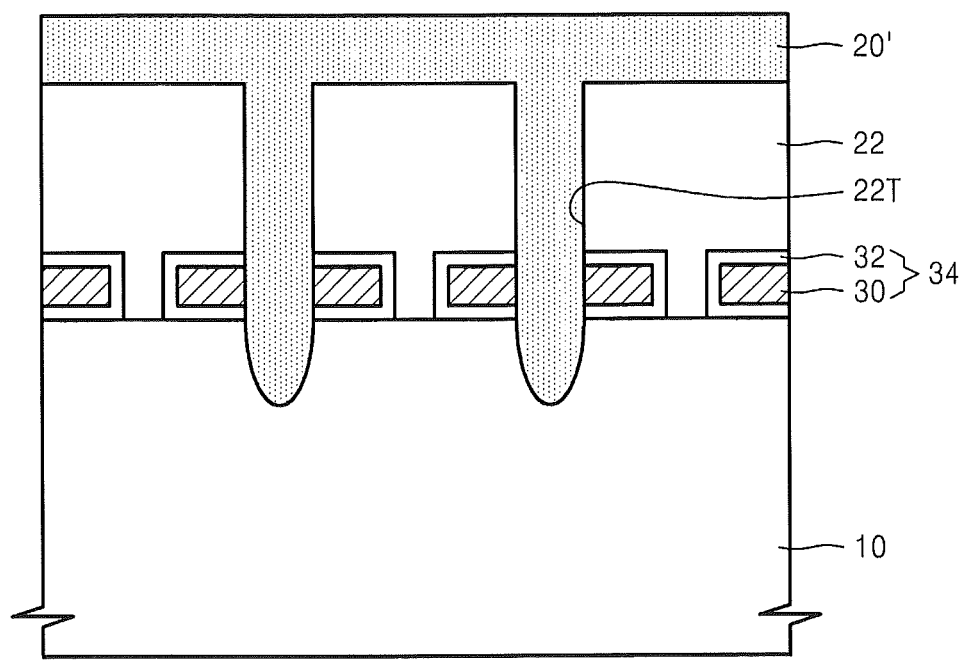

Referring to FIG. 25, an insulating material layer 20' that buries the first device isolation trenches 22T is formed to form first device isolation films 20a (refer to FIG. 26) that is self-aligned to respective ones of the first device isolation trenches 22T. For example, the insulating material layer 20' may be formed of an oxide, a nitride, or a combination of these materials.

Figure 26:
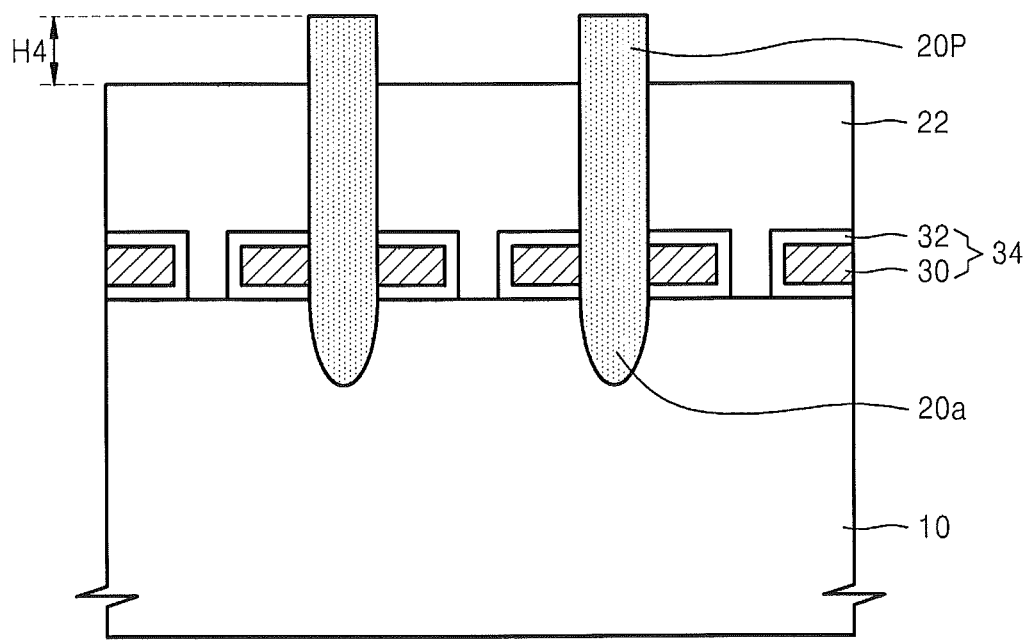

Referring to FIG. 26, a plurality of the first device isolation films 20a are formed by performing a planarizing process until an upper surface of the first doped region 22 is exposed. Each of both side surfaces of the first device isolation films 20a may contact the separated word lines 34. The planarizing process may be, for example, a CMP process.

A portion of the upper surface of the first doped region 22 is removed by performing an anisotropic etching process so that the protrusion units 20P, which are portions of the first device isolation films 20a, protrude upwards by a predetermined height H4 from the upper surface of the first doped region 22. Only a material used to form the first doped region 22 may be selectively removed by the anisotropic etching process.

The height H4 may determine a height of spacers 15S in a subsequent process for forming the spacers 15S described with reference to FIG. 28. The height H4 may be, for example, in a range from about 2 times to about 5 times larger than the first length L1 of FIG. 19.

As an example, the formation of the first doped region 22 (refer to FIG. 21) is described by injecting a dopant after forming the epitaxial layer 22'. However, the formation of the first doped region 22 according to the current inventive concept is not limited thereto. That is, the first doped region 22 may be formed by injecting a dopant into the epitaxial layer 22' before forming the spacer material layer 15 on sidewalls of the protrusion units 20P.

Figure 27:
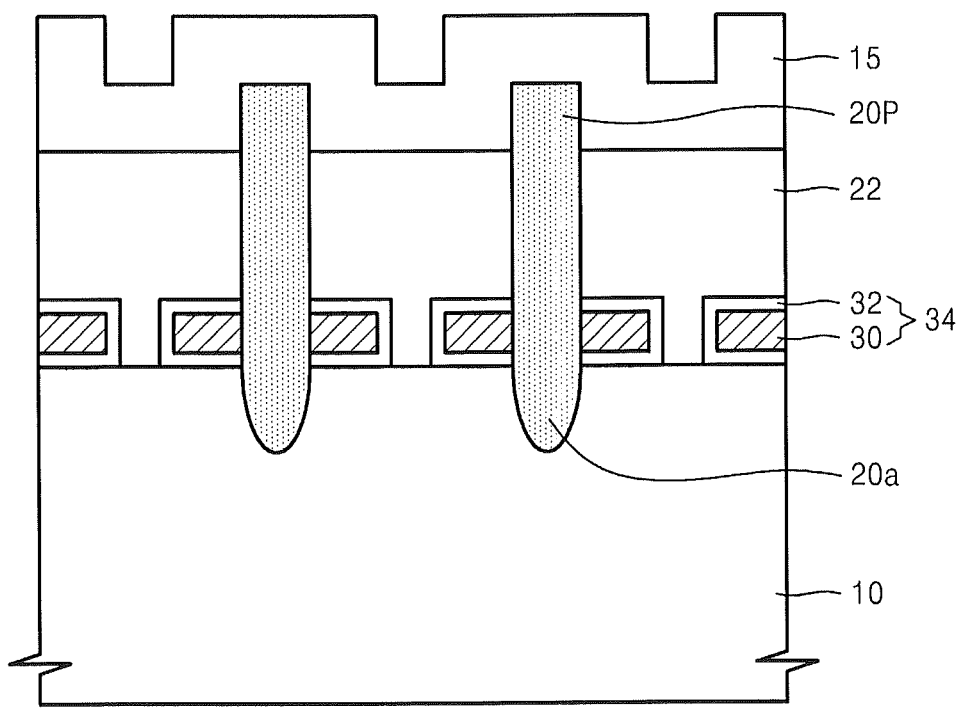

Referring to FIG. 27, the spacer material layer 15 is formed to cover the exposed surface of the first doped region 22 and the protrusion units 20P of the first device isolation films 20a.

The spacer material layer 15 may be formed of a material having a high etch selectivity ratio and a high etch selectivity with respect to the first doped region 22 and the first device isolation films 20a. The etch-selectivity may be quantitatively expressed through a ratio of an etching speed of a layer to that of another layer. The spacer material layer 15 may be formed of, for example, a silicon oxide or a silicon nitride. For example, when the first device isolation films 20a is an oxide film, the spacer material layer 15 may be a silicon nitride film. An ALD process may be used to form the spacer material layer 15 on the first doped region 12 with a uniform thickness.

Figure 28:
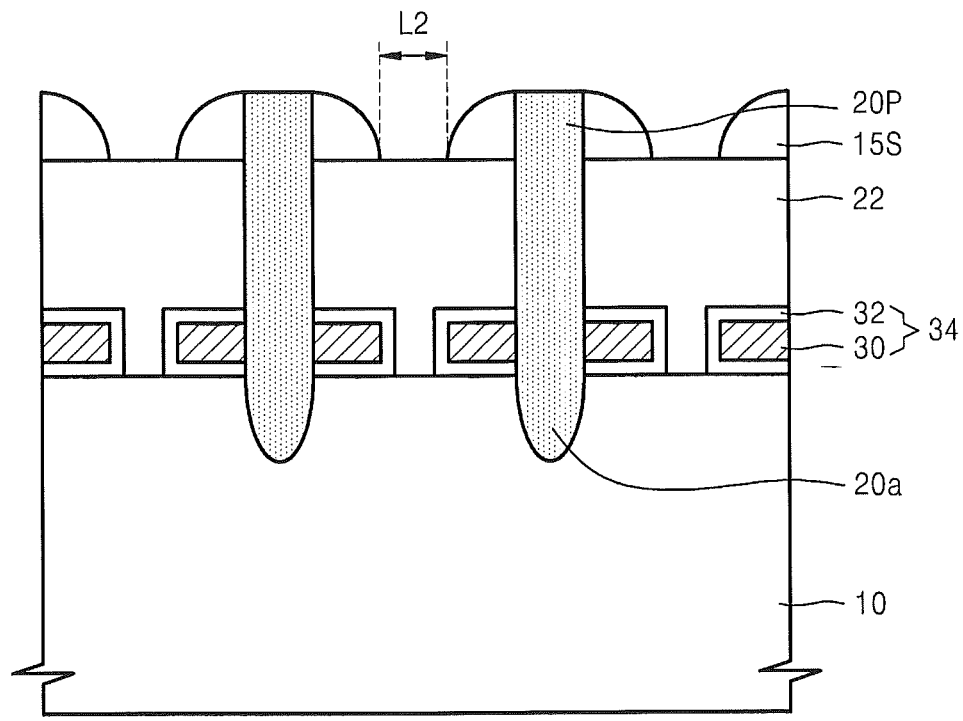

Referring to FIGS. 27 and 28, spacers 15S are formed by removing portions of the spacer material layer 15. That is, portions of the spacer material layer 15 may be removed by performing an etch-back process so that the upper surfaces of the first device isolation films 20a and a portion of an upper surface the first doped region 22 are exposed. And thus, the spacers 15S are formed on both sidewalls of the first device isolation films 20a.

The spacers 15S may be used as etch masks for forming second device isolation trenches 24T (refer to FIG. 29) in a subsequent process. Second lengths L2 of the first doped region 22 exposed through the spacers 15S may correspond to the size of the second device isolation trenches 24T (refer to FIG. 30).

Figure 29:
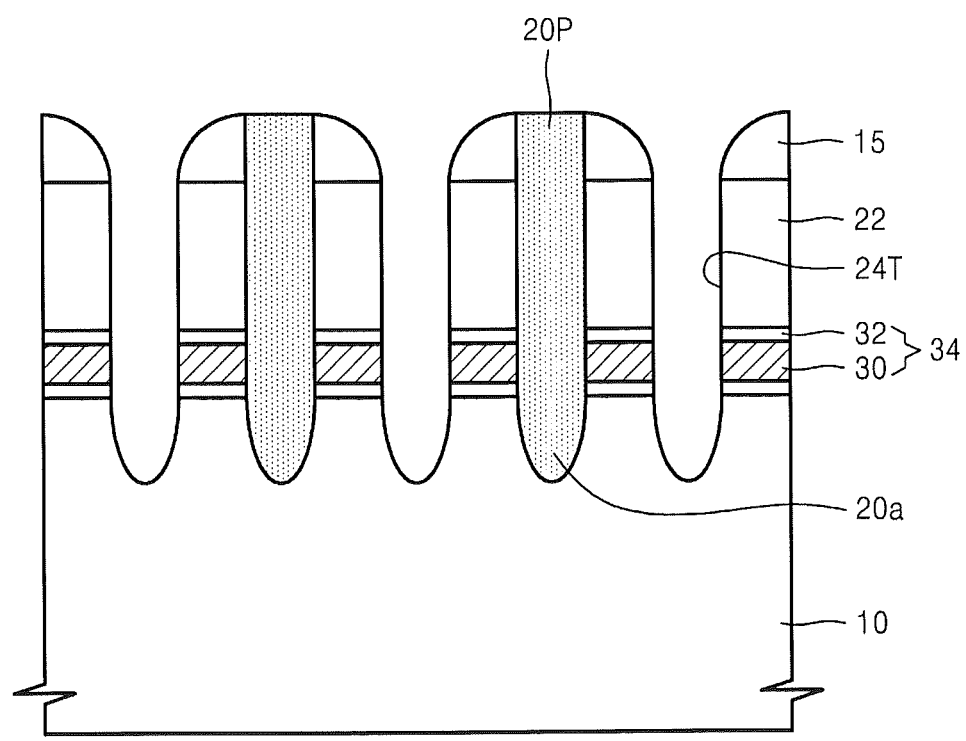

Referring to FIG. 29, the second device isolation trenches 24T are formed by etching the exposed first doped region 22 and the substrate 10 using the spacers 15S and the protrusion units 20P as etch masks so that a side surface of each of the word lines 34 is exposed.

In FIG. 29, the second device isolation trenches 24T are formed to expose a side surface of each of the word lines 34. However, the formation of the second device isolation trenches 24T according to the current inventive concept is not limited thereto. That is, the second device isolation trenches 24T may be formed separately from the word lines 34 by a predetermined distance.

Figure 30:
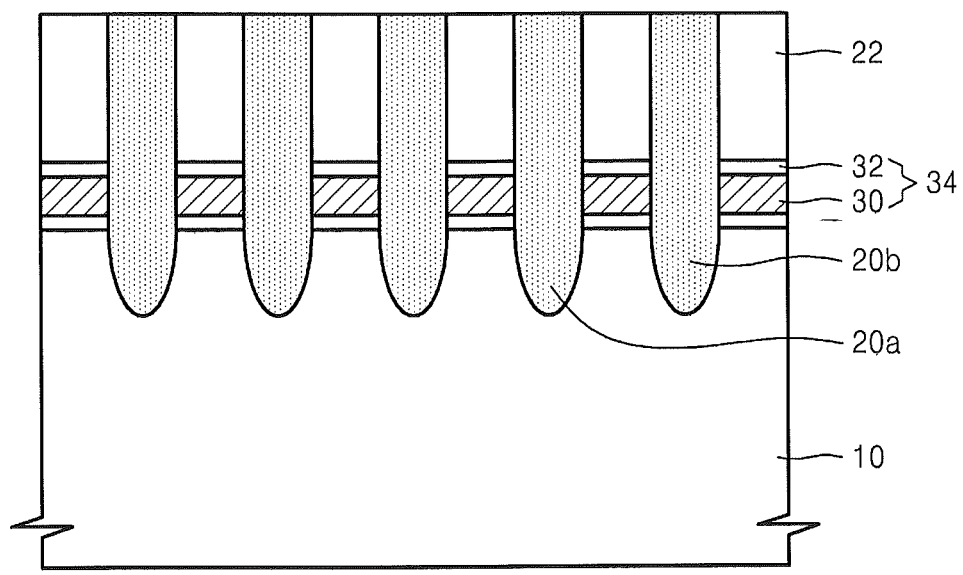

Referring to FIGS. 29 and 30, a process of removing the spacers 15S is performed. An insulating material layer is buried in the second device isolation trenches 24T.

The insulating material layer on the first doped region 22 and the protrusion units 20P on the first device isolation films 20a may be removed so that the first doped region 22 between the first device isolation films 20a and the second device isolation films 20b is exposed.

The semiconductor device 1 of FIG. 2 may be formed by performing the same process described with reference to FIGS. 16 and 17. According to various embodiments, a sacrificial pattern is formed in advance in the interlayer insulating film 16 with respect to a region for forming the word lines 34. Therefore, the word lines 34 may be readily formed without performing a sidewall etching process which is required for forming additional sidewall trenches in the substrate 10.

FIGS. 31 through 35 are cross-sectional views for explaining a method of manufacturing a semiconductor device, according to various embodiments of the inventive concept. In the current embodiment, a method of manufacturing the semiconductor device 1 of FIG. 2 is described. In FIGS. 31 through 35, like reference numerals are used to indicate elements that are substantially identical to the elements of FIGS. 4 through 17, and thus, a detailed description thereof will not be repeated.

Figure 31:
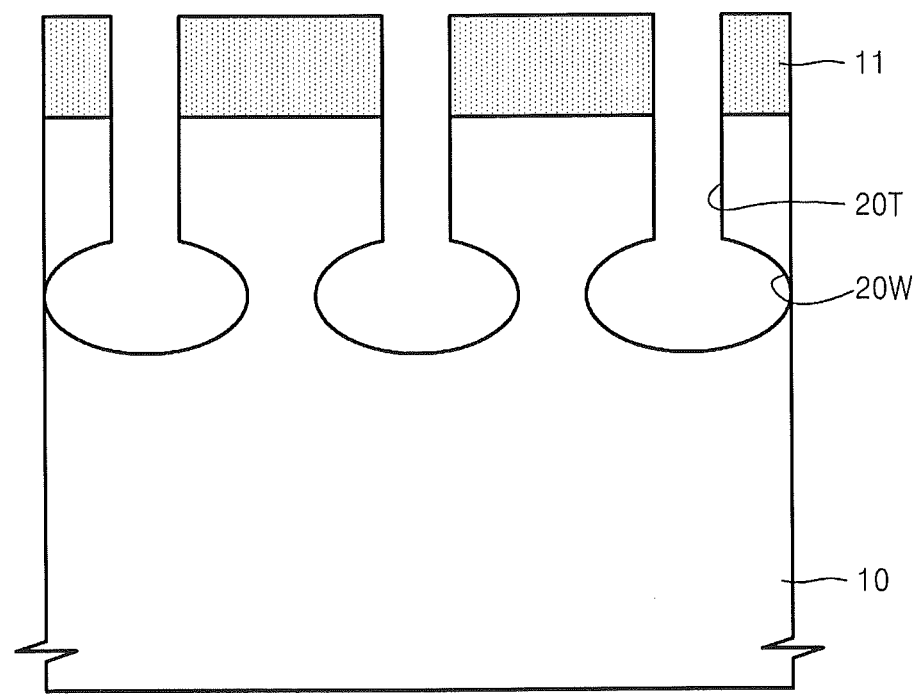
FIGS. 31 through 35 are cross-sectional views for explaining a method of manufacturing a semiconductor device, according to various embodiments of the inventive concept.

Referring to FIG. 31, a mask 11 is formed on a substrate 10 to form trenches 20T. The mask 11 may be patterned by a photolithography process.

The trenches 20T are formed by etching the substrate 10 using the mask 11.

Side trenches 20W are formed on lower parts of the trenches 20T by performing a sidewall etching process. The side trenches 20W may be used cavities in which word lines 36 (refer to FIG. 33) are formed.

The trenches 20T may be formed by using an anisotropic etching process and the side trenches 20W are formed by using an isotropic etching process. The anisotropic etching process may be plasma etching. However, the etching according to the current inventive concept is not limited thereto.

Figure 32:
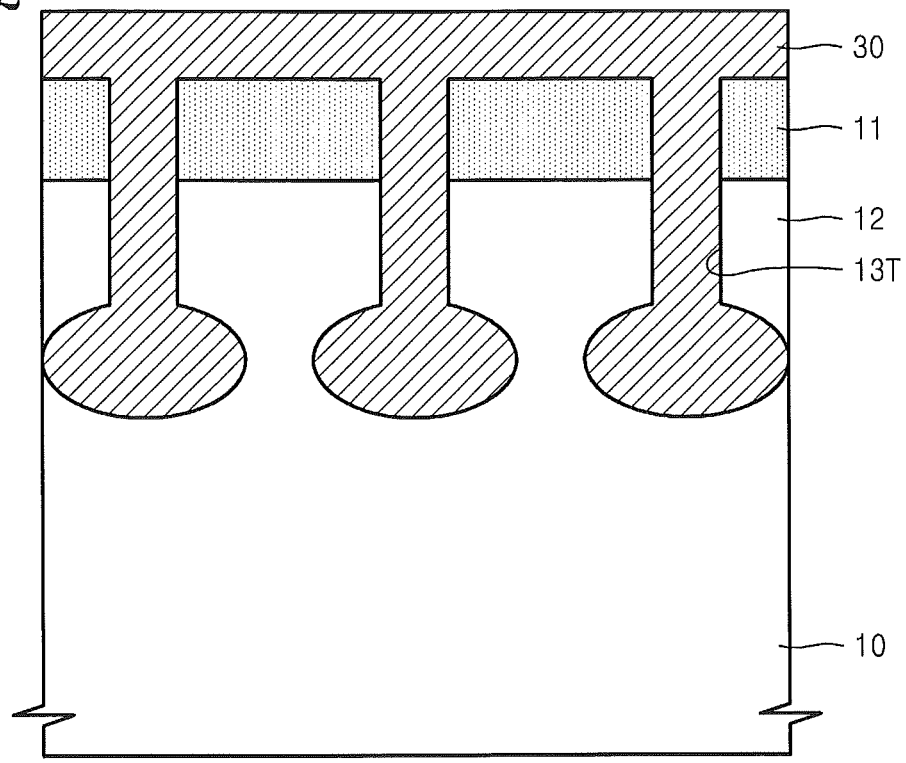

Referring to FIG. 32, a metal film 30 may be deposited in the trenches 20T and the side trenches 20W to form word lines 36 (refer to FIG. 33) in the side trenches 20W. The metal film 30 may be formed by a CVD method, a PVD method, or an ALD method, but the formation of the metal film 30 is not limited thereto.

Figure 33:
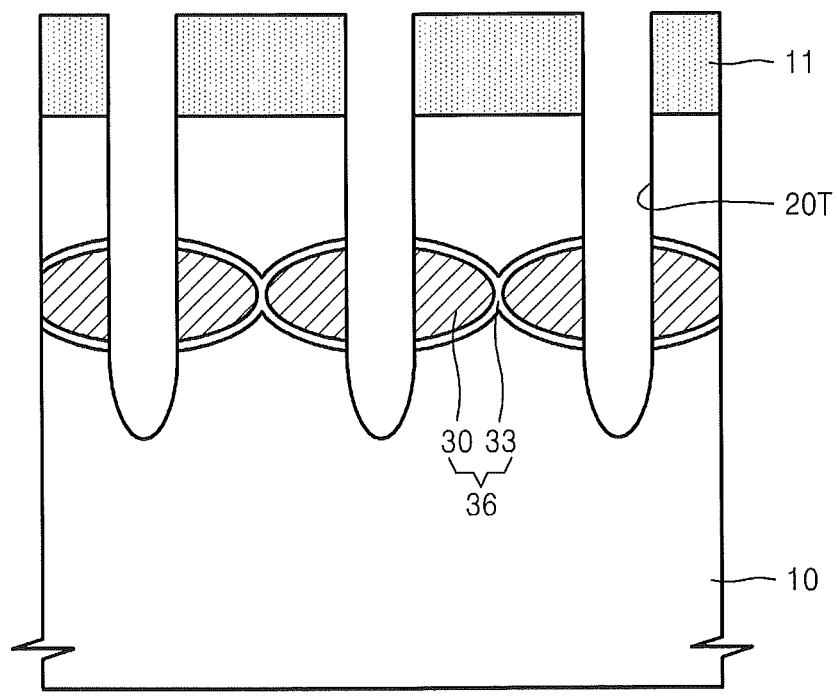

Referring to FIGS. 32 and 33, the metal film 30 formed on the mask 11 is removed by an anisotropic etching process.

First device isolation trenches 20T for forming device isolation films 20 (refer to FIG. 34) are formed by performing an anisotropic etching, and at the same time, the word lines 36 that are separated on both sides of the first device isolation trenches 20T are formed.

The word line 36 may further include a metal silicide film 33. The metal silicide film 33 may be formed by heat treating the metal film 30. The metal silicide film 33 may vary according to the kind of metal material for forming the metal film 30.

Figure 34:
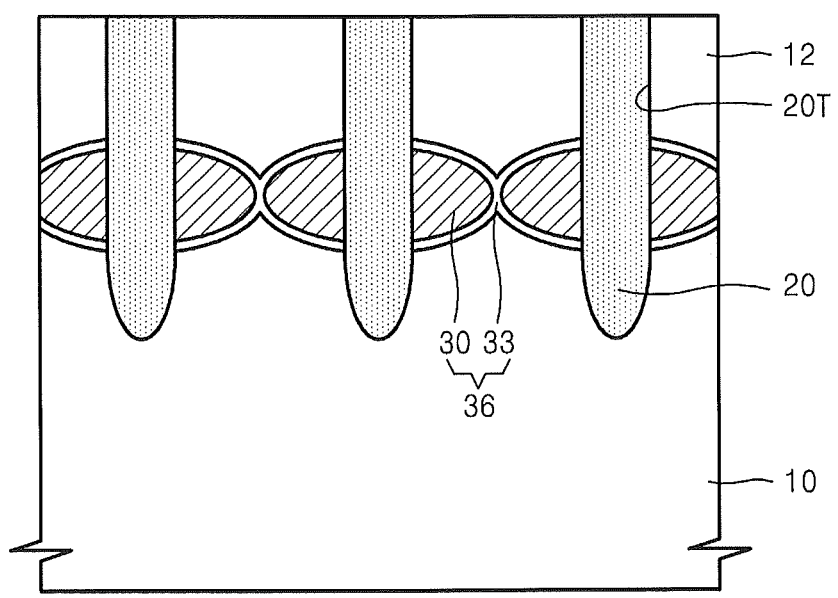

Referring to FIG. 34, an insulating material for forming the device isolation films 20 is deposited in the trenches 20T.

The insulating material may be formed by, for example, a CVD method, a PVD method, or an ALD method.

The insulating material may be formed of an oxide, a nitride, or a combination of these materials. The insulating material may be, for example, a composite film of a buffer oxide film, a trench liner nitride film, and a buried oxide film. Also, the insulating material may be one of an HTO, an HDP oxide, a TEOS, a BPSG, or a USG. After forming the insulating material, an additional annealing process for increasing film density may be performed in the process.

A planarizing process is performed until an upper surface of the substrate 10 is exposed so that the device isolation films 20 are formed. The planarizing process may be, for example, a CMP process. The device isolation films 20 may also be formed by performing an isotropic etching process.

A first doped region 12 is formed by injecting a dopant into the exposed upper surface of the substrate 10. The dopant may be an n-type dopant.

Figure 35:
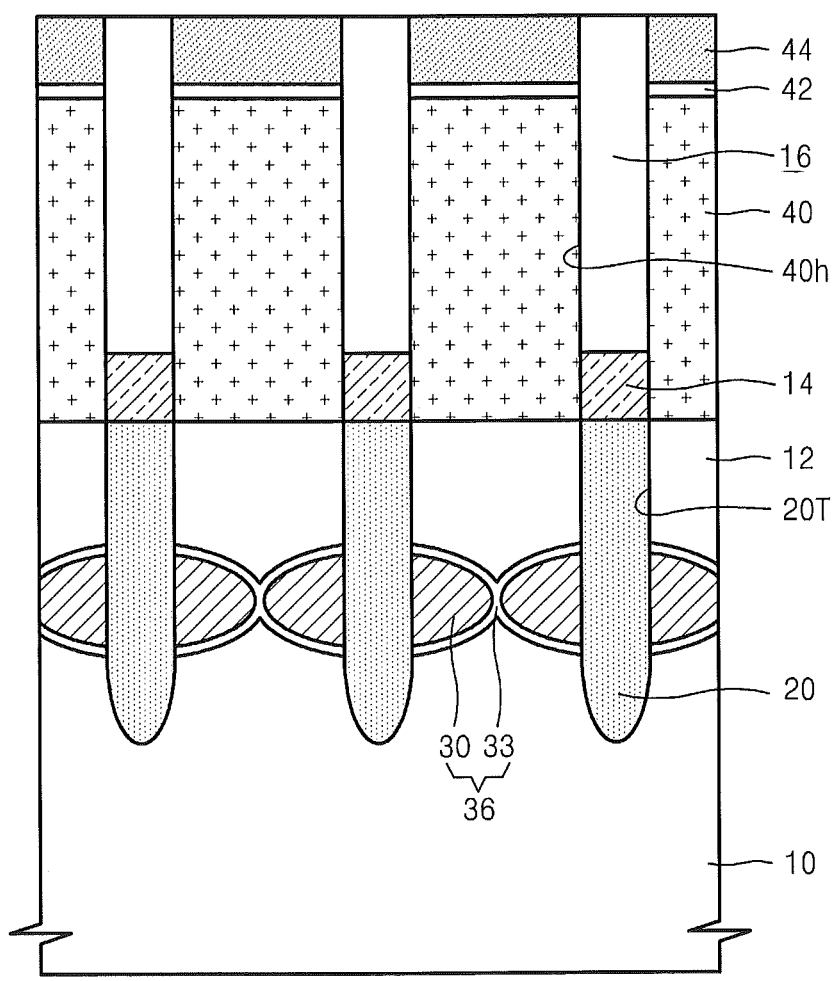

The semiconductor device 2 FIG. 35 may be formed by performing the same process described with reference to FIGS. 16 and 17.

Figure 36:
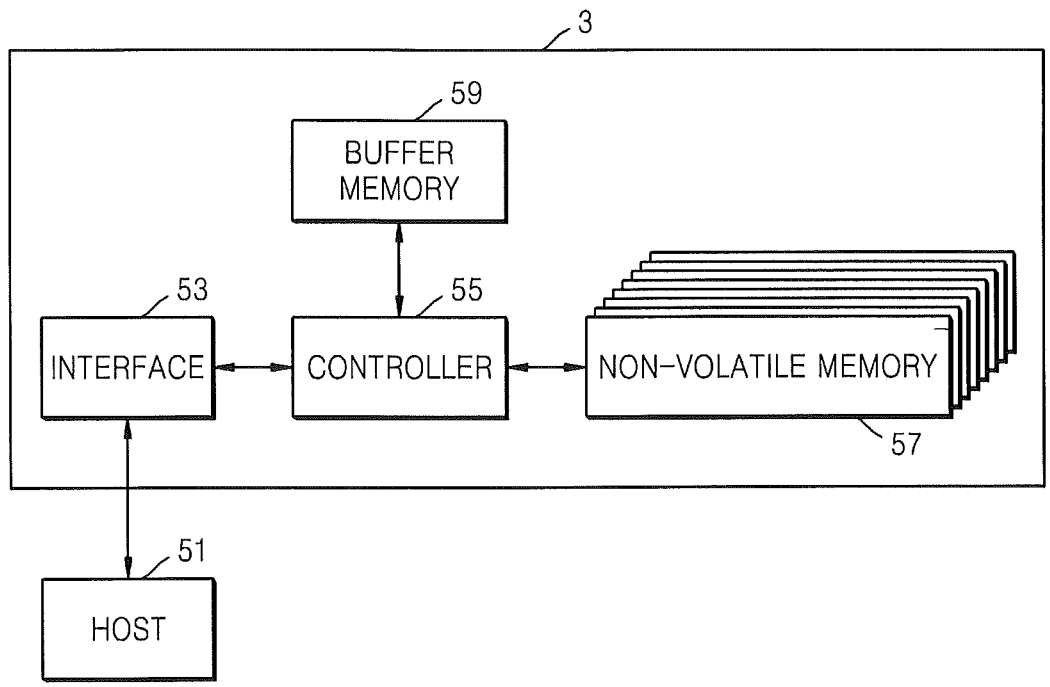
FIG. 36 is a schematic block diagram of an electronic system that employs the semiconductor device according to various embodiments of the inventive concept.

FIG. 36 is a schematic block diagram of an electronic system that employs a semiconductor device according to various embodiments of the inventive concept. The electronic system may be a data storage device such as a solid state disk (SSD).

Referring to FIG. 36, a SSD 3 may include an interface 53, a controller 55, a non-volatile memory 57, and a buffer memory 59. The non-volatile memory 57 may employ a diode D described in various embodiments according to the inventive concept as a switching device.

The non-volatile memory 57 may be a resistive memory. For example, the non-volatile memory 57 may include a data storage element selected from the group consisting of a phase change material pattern, a magnetic tunnel junction (MTJ) pattern, a polymer pattern, and an oxide pattern.

The SSD 3 is a device that stores information by using a semiconductor. The SSD 3 has various advantages, for example, the SSD 3 has a higher response speed than a hard disk drive (HDD), has a low mechanical delay, a low failure rate, and a low heat and noise generation, and may be miniaturized and lightweight. The SSD 3 may be used in notebook personal computers, desk top computers, MP3 players, or mobile storage devices.

The controller 55 may be adjacent to the interface 53 and is electrically connected to the interface 53. The controller 55 may include a memory controller and a buffer controller. The non-volatile memory 57 may be adjacent to the controller 55 and may be electrically connected to the controller 55. The data storing capacity of the SSD 3 may correspond to that of the non-volatile memory 57. The buffer memory 59 may be adjacent to the controller 55 and may be electrically connected to the controller 55.

The interface 53 may be connected to a host 51 and may perform transmitting/receiving electrical signals such as data. For example, the interface 53 may be a device that uses a specification such as SATA, IDE, SCSI, and/or a combination of these specifications. The non-volatile memory 57 may be connected to the interface 53 through the controller 55. The non-volatile memory 57 may store data received through the interface 53. Even though power supply to the SSD 3 is stopped, data stored in the non-volatile memory 57 may be kept.

The buffer memory 59 may include a volatile memory. The volatile memory may be a dynamic random access memory (DRAM) and/or a static random access memory (SRAM). The buffer memory 59 has a relatively high operation speed compared to the non-volatile memory 57.

The interface 53 may have a faster data processing speed than that of the non-volatile memory 57. Here, the buffer memory 59 may temporarily store data. Data received through the interface 53 may be temporarily stored in the buffer memory 59 through the controller 55, and afterwards, the data may be permanently stored in the non-volatile memory 57 in a step with a data writing speed of the non-volatile memory 57. Also, of the data stored in the non-volatile memory 57, data frequently used may be temporarily stored in the buffer memory 59 by reading in advance. That is, the buffer memory 59 may increase an effective operation speed and may reduce an error generation rate of the SSD 3.

Figure 37:
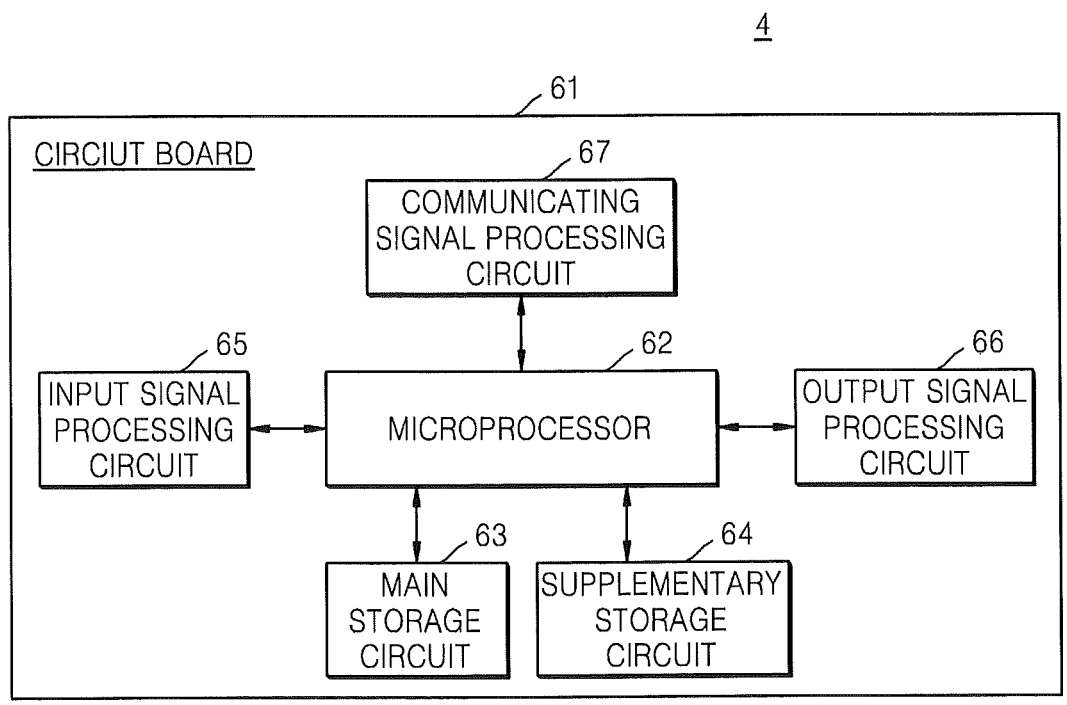
FIG. 37 is a schematic block diagram of an electronic circuit substrate according to various embodiments of the inventive concept.

FIG. 37 is a schematic block diagram of an electronic circuit substrate according to various embodiments of the inventive concept.

Referring to FIG. 37, an electronic circuit board 4 is provided. The electronic circuit board 4 includes: a microprocessor 62 disposed on a circuit board 61; a main storage circuit 63 and a supplementary storage circuit 64, that communicate with the microprocessor 62; an input signal processing circuit 65 that transmits a command to the microprocessor 62; an output signal processing circuit 66 that receives a command from the microprocessor 62; and a communicating signal processing circuit 67 that communicates electrical signals with other circuit substrates. Arrows in FIG. 37 may indicate pathways for transmitting electrical signals.

The microprocessor 62 may receive and process various electrical signals and may output the processing results, and may control other constituent elements of the electronic circuit board 4. The microprocessor 62 may be understood as a central processing unit (CPU) and/or a main control unit (MCU). The main storage circuit 63 may temporarily store data that is always or frequently used or data before and after processing. The main storage circuit 63 requires a rapid response, and thus, may be configured of a semiconductor memory. More specifically, the main storage circuit 63 may be a semiconductor memory that is referred to as a cache, and may be SRAM, DRAM, PRAM, and other application memories, for example, utilized RAM, ferro-electric RAM, fast cycle RAM, phase changeable RAM (PRAM), magnetic RAM (MRAM), and other semiconductor memories. Additionally, the main storage circuit 63 has nothing to do with volatility/non-volatility, and may include a random access memory.

Accordingly, the main storage circuit 63 may include a memory device formed by using a device and/or a manufacturing method according to at least one embodiment of the embodiments according to the current inventive concept. The main storage circuit 63 may include at least one semiconductor module.

The supplementary storage circuit 64 may be a large memory device and may be a non-volatile semiconductor memory such as a flash memory or a phase memory or a HDD that uses a magnetic field, and also, may be a compact disc that uses light. The supplementary storage circuit 64 may be used when a large capacity of data is needed to store instead of a rapid speed, compared to the main storage circuit 63.

The supplementary storage circuit 64 is nothing to do with random/non-random, and may include a non-volatile memory device. The supplementary storage circuit 64 may include at least one semiconductor module. The input signal processing circuit 65 may convert an external command to an electrical signal or may transmits an electrical signal transmitted from the outside to the microprocessor 62. The command or electrical signal transmitted from the outside may be an operational command, an electrical signal to be processed, or a data to be stored. The input signal processing circuit 65 may be, for example, a key board, a mouse, a touch pad, an image recognition device or a terminal signal processing circuit that processes signals transmitted from various sensors, a scanner or an image signal processing circuit that processes an input of an image signal of a camera, or an interface of various sensors or input signals.

The output signal processing circuit 66 may be a configuration element for transmitting an electrical signal processed by the microprocessor 62 to the outside. For example, the output signal processing circuit 66 may be a graphic card, an image processor, an optical transformer, or an interface circuit having various functions. The communicating signal processing circuit 67 is a configuration element for inputting/outputting an electrical signal directly to other electronic systems or other circuit substrates without transmitting through the input signal processing circuit 65 or the output signal processing circuit 66. For example, the communicating signal processing circuit 67 may be a modem of a personal computer system, a LAN card, or various interface circuits.

Figure 38:
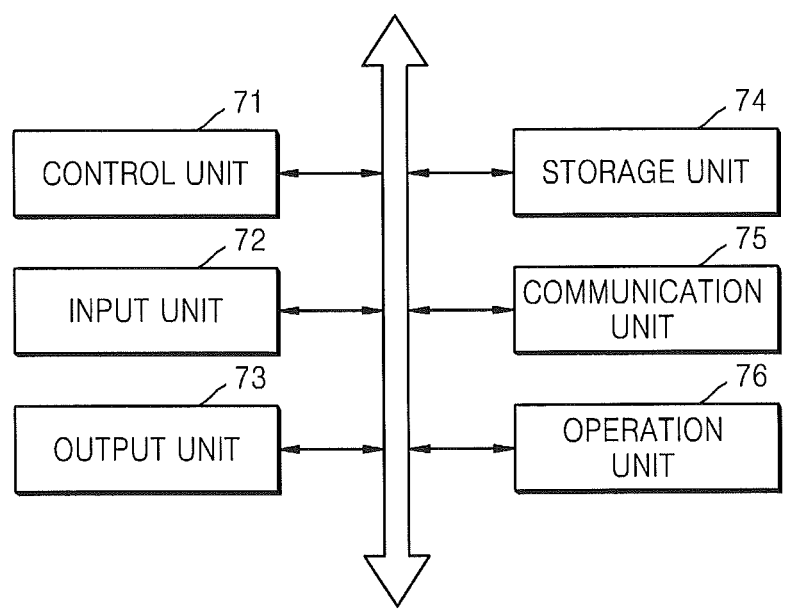
FIG. 38 is a schematic block diagram of an electronic system according to various embodiments of the inventive concept.

FIG. 38 is a schematic block diagram of an electronic system 5 according to various embodiments of the inventive concept.

Referring to FIG. 38, the electronic system 5 may include a control unit 71, an input unit 72, an output unit 73, and a storage unit 74, and may further include a communication unit 75 and an operation unit 76.

The control unit 71 may collectively control the electronic system 5 and each of the units of the electronic system 5. The control unit 71 may be a central processing unit or a central control unit, and may include the electronic circuit board 4. The input unit 72 may transmit an electrical command signal to the control unit 71.

The input unit 72 may be an image recognition device, such as a key board, a key pad, a mouse, a touch pad, or a scanner, or various input sensors.

The output unit 73 may output a processed result in response to an electrical command signal received from the control unit 71. The output unit 73 may be a monitor, a printer, a beam irradiator, or various mechanical devices.

The storage unit 74 may be a configuration element for temporarily or permanently storing an electrical signal to be processed or an electrical signal processed by the controller 71. The storage unit 74 may be a magnetic storage device such as a semiconductor memory or a hard disk, an optical storage device such as a compact disc, or various servers having a data storing function. The storage unit 74 may include a semiconductor memory formed by using at least a device and/or a manufacturing method according to various embodiments of the embodiments of the inventive concept.

The communication unit 75 may transmit and receive an electrical signal to and from other electronic systems in response to electrical command signal received from the control unit 71. The communication unit 75 may be a wire communication device such as a modem or a LAN card, a wireless communication device such as a WiBro interface, or an infrared ray port.

The operation unit 76 may physically or mechanically operate in response to a command of the control unit 71. For example, the operation unit 76 may be a configuration element that mechanically operates, such as a floater, an indicator, or an up/down operator. The electronic system 5 according to the technical spirit of the inventive concept may be a computer, a network server, a networking printer, a scanner, a wireless controller, a mobile communication terminal, a switchboard, or other electronic products that operate according to a program.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a plurality of insulating line patterns extending in a direction in a substrate;
   a plurality of word lines alternately with ones of the plurality of insulating line patterns, the plurality of word lines extending in the direction and comprising a metal;
   a plurality of first doped regions on respective ones of the plurality of the word lines and between two adjacent ones of the plurality of insulating line patterns;
   an interlayer insulating film on the plurality of insulating line patterns and the plurality of first doped regions, the interlayer insulating film including a plurality of openings exposing upper surfaces of ones of the plurality of first doped regions; and
   a plurality of second doped regions contacting respective ones of the plurality of first doped regions within the openings.

2. The semiconductor device of claim 1, wherein the plurality of insulating line patterns comprise a plurality of first insulating line patterns alternating with a plurality of second insulating line patterns, and ones of the plurality of first insulating line patterns contact respective ones of the plurality of word lines.

3. The semiconductor device of claim 2, wherein an area where one of the plurality of first insulating line patterns contacts one of the plurality of word lines is larger than an area where one of the plurality of second insulating line patterns contacts the one of the plurality of word lines.

4. The semiconductor device of claim 1, wherein ones of the plurality of first doped regions comprise an n-type dopant, ones of the plurality of second doped regions comprise a p-type dopant, and one of the plurality of first doped regions and a respective one of the plurality of second doped regions form a diode.

5. The semiconductor device of claim 1, wherein upper surfaces of ones of the plurality of first doped regions are coplanar with upper surfaces of ones of the plurality of insulating line patterns.

6. The semiconductor device of claim 1, further comprising an etch stop film between the interlayer insulating film and the plurality of insulating line patterns, wherein the etch stop film covers the plurality of insulating line patterns and exposes upper surfaces of the plurality of first doped regions.

7. The semiconductor device of claim 1, wherein each of the plurality of word lines comprises a metal silicide film.

8. The semiconductor device of claim 1, wherein ones of the plurality of second doped regions have a crystal direction identical to those of ones of the plurality of first doped regions.

* * * * *

UNITED STATES PATENT AND TRADEMARK OFFICE
CERTIFICATE OF CORRECTION

| | |
|---|---|
| PATENT NO. | : 8,969,996 B2 |
| APPLICATION NO. | : 13/780793 |
| DATED | : March 3, 2015 |
| INVENTOR(S) | : Kim et al. |

Page 1 of 1

It is certified that error appears in the above-identified patent and that said Letters Patent is hereby corrected as shown below:

<u>On Title Page:</u>
Item 75, Inventors: Please correct "Yong-june Kim, Suwon-si, (KR);"
to read -- Yong-jun Kim, Suwon-si, (KR); --

Signed and Sealed this
Fourteenth Day of July, 2015

Michelle K. Lee
*Director of the United States Patent and Trademark Office*